(12) United States Patent
Akagi et al.

(10) Patent No.: US 12,095,468 B2
(45) Date of Patent: Sep. 17, 2024

(54) DLL CIRCUIT AND DISTANCE MEASURING SENSOR

(71) Applicant: SONY SEMICONDUCTOR SOLUTIONS CORPORATION, Kanagawa (JP)

(72) Inventors: Miho Akagi, Kanagawa (JP); Yohtaro Yasu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/245,013

(22) PCT Filed: Aug. 12, 2021

(86) PCT No.: PCT/JP2021/029711
§ 371 (c)(1),
(2) Date: Mar. 13, 2023

(87) PCT Pub. No.: WO2022/064893
PCT Pub. Date: Mar. 31, 2022

(65) Prior Publication Data
US 2023/0370070 A1 Nov. 16, 2023

(30) Foreign Application Priority Data
Sep. 24, 2020 (JP) .................. 2020-159287

(51) Int. Cl.
*H03K 5/133* (2014.01)
*G01S 17/894* (2020.01)
(Continued)

(52) U.S. Cl.
CPC .......... *H03L 7/0814* (2013.01); *G01S 17/894* (2020.01); *H03K 5/133* (2013.01); *H03K 5/135* (2013.01)

(58) Field of Classification Search
None
See application file for complete search history.

(56) References Cited

U.S. PATENT DOCUMENTS 6,448,826 B1 * 9/2002 Ooishi .................. H03K 5/133
327/158

FOREIGN PATENT DOCUMENTS

JP    2001-111394 A    4/2001
JP    2003-264452 A    9/2003
(Continued)

OTHER PUBLICATIONS

International Search Report and Written Opinion of PCT Application No. PCT/JP2021/029711, issued on Oct. 19, 2021, 08 pages of ISRWO.

*Primary Examiner* — Cassandra F Cox
(74) *Attorney, Agent, or Firm* — CHIP LAW GROUP

(57) ABSTRACT

A DLL circuit (110) includes a phase delay circuit (114), a selection circuit (115), a detection circuit (117), and a clock stop circuit (116). The phase delay circuit (114) generates a plurality of delayed signals having different phases according to a clock signal. The selection circuit (115) selects one of the plurality of delayed signals as an output signal according to a setting signal. The detection circuit (117) detects a timing of switching the setting signal. The clock stop circuit (116) stops input of the clock signal to the phase delay circuit (114) for a predetermined period including the timing detected by the detection circuit (117).

9 Claims, 21 Drawing Sheets

(51) Int. Cl.
　　　*H03K 5/135*　　　(2006.01)
　　　*H03L 7/081*　　　(2006.01)

(56)　　　　References Cited

FOREIGN PATENT DOCUMENTS

| | | |
|---|---|---|
| JP | 2004-054350 A | 2/2004 |
| JP | 2006-295719 A | 10/2006 |
| JP | 2010-225057 A | 10/2010 |
| WO | 2020/129954 A1 | 6/2020 |

* cited by examiner

DLL CIRCUIT AND DISTANCE MEASURING SENSOR

CROSS REFERENCE TO RELATED APPLICATIONS

This application is a U.S. National Phase of International Patent Application No. PCT/JP2021/029711 filed on Aug. 12, 2021, which claims priority benefit of Japanese Patent Application No. JP 2020-159287 filed in the Japan Patent Office on Sep. 24, 2020. Each of the above-referenced applications is hereby incorporated herein by reference in its entirety.

FIELD

The present disclosure relates to a DLL circuit and a distance measuring sensor.

BACKGROUND

There is a known delay lock loop (DLL) circuit that performs circuit-wise adjustment of a delay amount (time difference) generated between a clock signal from the outside of a chip and an internal clock signal. Various circuits have been proposed as DLL circuits (refer to Patent Literature 1, for example).

The DLL circuit is also used for signal generation having a predetermined phase relationship and delay duty. For example, by switching TAP output of the DLL circuit, it is possible to generate a signal having a desired phase relationship and delay duty.

CITATION LIST

Patent Literature

Patent Literature 1: JP2001-111394 A

SUMMARY

Technical Problem

The conventional DLL circuit has room for improvement in terms of increasing the switching speed of the TAP output. For example, in a case where the DLL circuit is reset once and the TAP output is switched, it takes time from resetting to restarting the DLL. That is, TAP output switching, in other words, DLL circuit output signal switching has been time consuming.

In view of this, the present disclosure proposes a DLL circuit and a distance measuring sensor capable of further increasing the switching speed of the output signal of the DLL circuit.

Note that the above problem or target is merely one of a plurality of problems or targets that can be solved or achieved by a plurality of embodiments disclosed in the present specification.

Solution to Problem

According to the present disclosure, a DLL circuit is provided. The DLL circuit includes a phase delay circuit, a selection circuit, a detection circuit, and a clock stop circuit. The phase delay circuit generates a plurality of delayed signals having different phases according to a clock signal. The selection circuit selects one of the plurality of delayed signals as an output signal according to a setting signal. The detection circuit detects a timing of switching the setting signal. The clock stop circuit stops input of the clock signal to the phase delay circuit for a predetermined period including the timing detected by the detection circuit.

DESCRIPTION OF EMBODIMENTS

Figure 1:
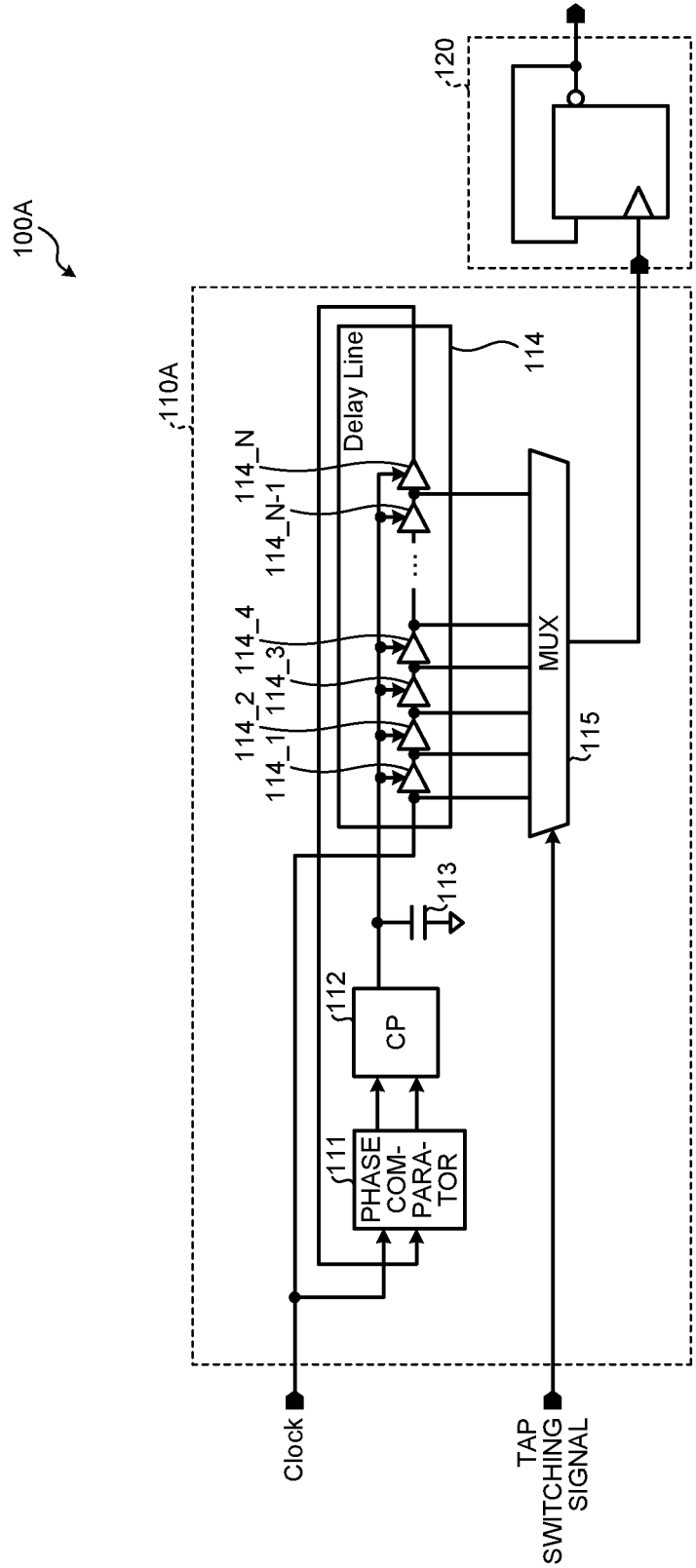
FIG. 1 is a diagram illustrating a configuration example of a signal generation circuit.

Hereinafter, embodiments of the present disclosure will be described in detail with reference to the accompanying drawings. Note that redundant descriptions will be omitted from the present specification and the drawings by assigning the same reference signs to components having substantially the same functional configuration.

One or more embodiments (examples, applications, and modifications) described below can each be implemented independently. On the other hand, at least some of the plurality of embodiments described below may be appropriately combined with at least some of other embodiments. The plurality of embodiments may include novel features different from each other. Accordingly, the plurality of embodiments can contribute to achieving or solving different objects or problems, and can exhibit different effects.

Note that the description will be provided in the following order.

1. DLL circuit
   1.1. Circuit configuration
   1.2. Switching operation
2. First Embodiment
   2.1. Circuit configuration
   2.2. Switching operation
3. Modifications
   3.1. First modification
   3.2. Second modification
4. Second Embodiment
   4.1. Schematic configuration example of distance measuring device
   4.2. Overview of distance measurement by indirect ToF method
   4.3. Overview of proposed technology
   4.4. Configuration example of distance measurement processing unit
   4.5. Drive pulse signal
5. Modification
   5.1. Third modification
6. Conclusion

1. DLL CIRCUIT

Before describing the present disclosure, an overview of a signal generation circuit 100A including a DLL circuit 110A according to the present disclosure will be described.

<1.1. Circuit Configuration>

A circuit configuration of the signal generation circuit 100A will be described with reference to FIG. 1. FIG. 1 is a diagram illustrating a configuration example of the signal generation circuit 100A. The signal generation circuit 100A includes a DLL circuit 110A and a divider circuit 120, and generates a phase shift clock signal by shifting the phase of the clock signal by a shift phase amount according to a TAP selection signal. More specifically, the DLL circuit 110A shifts the phase of the clock signal by a shift phase amount corresponding to the TAP selection signal, thereby generating a phase shift signal. The divider circuit 120 divides the phase shift signal generated by the DLL circuit 110A to generate a phase shift clock signal.

The DLL circuit 110A includes a phase comparator 111, a charge pump (CP) 112, a low-pass filter (LPF) 113, a phase delay circuit (delay line) 114, and a selection circuit (multiplexer (MUX)) 115.

The phase delay circuit 114 has a delay stage in which a plurality of voltage control delay circuits 114_1 to 114_N connected in series. An N-th delayed signal generated by the voltage control delay circuit 114_N at the last stage of the delay stage is input to the phase comparator 111. In addition, an n-th delayed signal generated by the voltage control delay circuit 114_n (n is an integer of 1 or more and N or less) of each stage of the delay stage is input to the selection circuit 115.

The phase comparator 111 performs phase comparison between the clock signal and the N-th delayed signal, and outputs a control signal corresponding to the comparison result to the charge pump 112. The charge pump 112 performs charge/discharge according to the control signal to generate a control voltage. High-frequency components of the control voltage are removed by the low-pass filter 113, and the resulted control voltage is input to each voltage control delay circuit 114_n of the phase delay circuit 114.

In response to the TAP selection signal, the selection circuit 115 selects one signal from the n-th delayed signal input from the phase delay circuit 114 and outputs the selected signal as a phase shift signal to the subsequent divider circuit 120. By selecting (switching) the TAP from which the n-th delayed signal is output, the selection circuit 115 outputs the phase shift signal.

The divider circuit 120 includes, for example, at least one flip-flop, and divides the phase shift signal output from the DLL circuit 110A to generate a phase shift clock signal. Here, for example, it is assumed that the divider circuit 120 divides the cycle of the phase shift signal by two to generate the phase shift clock signal.

<1.2. Switching Operation>

Next, a case of switching the shift phase amount of the phase shift signal output from the DLL circuit 110A will be described with reference to FIGS. 2A, 2B, 2C, 2D, 2E, 2F, 2G, 2H, 21, 2J, 3A, 3B, 3C, 3D, 3E, 3F, 3G, 3H, 3I, and 3J. FIGS. 2A, 2B, 2C, 2D, 2E, 2F, 2G, 2H, 21, 2J, 3A, 3B, 3C, 3D, 3E, 3F, 3G, 3H, 3I, and 3J are diagrams illustrating switching of the shift phase amount of the phase shift signal of the DLL circuit 110A.

Figure 2:
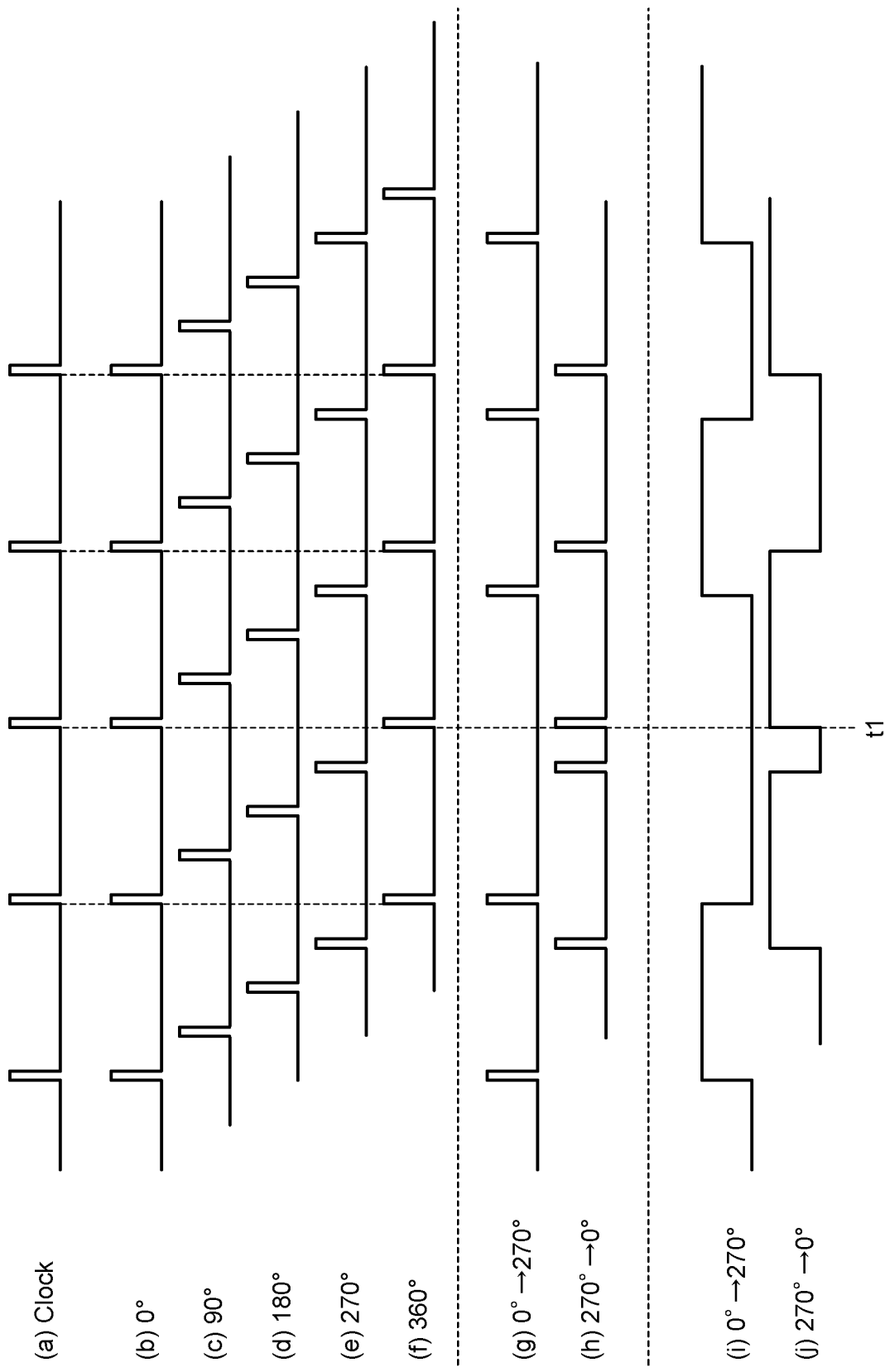
FIGS. 2A, 2B, 2C, 2D, 2E, 2F, 2G, 2H, 2I, and 2J are diagrams illustrating switching of a shift phase amount of a phase shift signal of a DLL circuit.

FIGS. 2A, 2B, 2C, 2D, 2E, 2F, 2G, 2H, 21, and 2J illustrate switching of the shift phase amount in a case where the duty ratio of the clock signal input to the DLL circuit 110A is ideally small. FIG. 2A illustrates a clock signal input to the DLL circuit 110A.

FIGS. 2B, 2C 2D, 2E, and 2F are examples of the delayed signal output from the TAP of each voltage control delay circuit 114_n of the phase delay circuit 114. FIG. 2B illustrates a delayed signal having a shift phase amount of 0 degrees with respect to the clock signal; FIG. 2C illustrates a delayed signal having a shift phase amount of 90 degrees with respect to the clock signal. FIG. 2D illustrates a delayed signal having a shift phase amount of 180 degrees with respect to the clock signal; FIG. 2E illustrates a delayed signal having a shift phase amount of 270 degrees with respect to the clock signal. FIG. 2F illustrates a delayed signal in which the shift phase amount is delayed by 360 degrees with respect to the clock signal, that is, delayed by one cycle from the clock signal.

In the example illustrated in FIGS. 2A, 2B, 2C, 2D, 2E, 2F, 2G, 2H, 2I, and 2J, the selection circuit 115 selects one of the delayed signals of FIGS. 2B, 2C, 2D, 2E, and 2F by switching TAP, and outputs the selected phase shift signal. FIGS. 2G and 2H illustrate examples of the phase shift signal output from the selection circuit 115.

FIG. 2G illustrates the phase shift signal when the shift phase amount is switched from 0 degrees to 270 degrees at time t1. In this case, the selection circuit 115 outputs the delayed signal of FIG. 2B before time t1 and outputs the delayed signal of FIG. 2E on and after time t1, as the phase shift signal.

In addition, FIG. 2H illustrates the phase shift signal when the shift phase amount is switched from 270 degrees to 0 degrees at time t1. In this case, the selection circuit 115 outputs the delayed signal of FIG. 2E before time t1 and outputs the delayed signal of FIG. 2A on and after time t1, as the phase shift signal.

FIGS. 2I and 2J are examples of the phase shift clock signal generated by the divider circuit 120. FIG. 2I illustrates a phase shift clock signal obtained by dividing the phase shift signal illustrated in FIG. 2G into two cycles. In addition, FIG. 2J illustrates a phase shift clock signal obtained by dividing the phase shift signal illustrated in FIG. 2H into two cycles.

Here, although FIGS. 2A, 2B, 2C, 2D, 2E, 2F, 2G, 2H, 2I, and 2J assume that the duty ratio of the clock signal is ideally small, the duty ratio of the clock signal actually input to the DLL circuit 110A has a predetermined magnitude. For example, the duty ratio of the clock signal illustrated in FIG. 3A is 50%.

Figure 3:
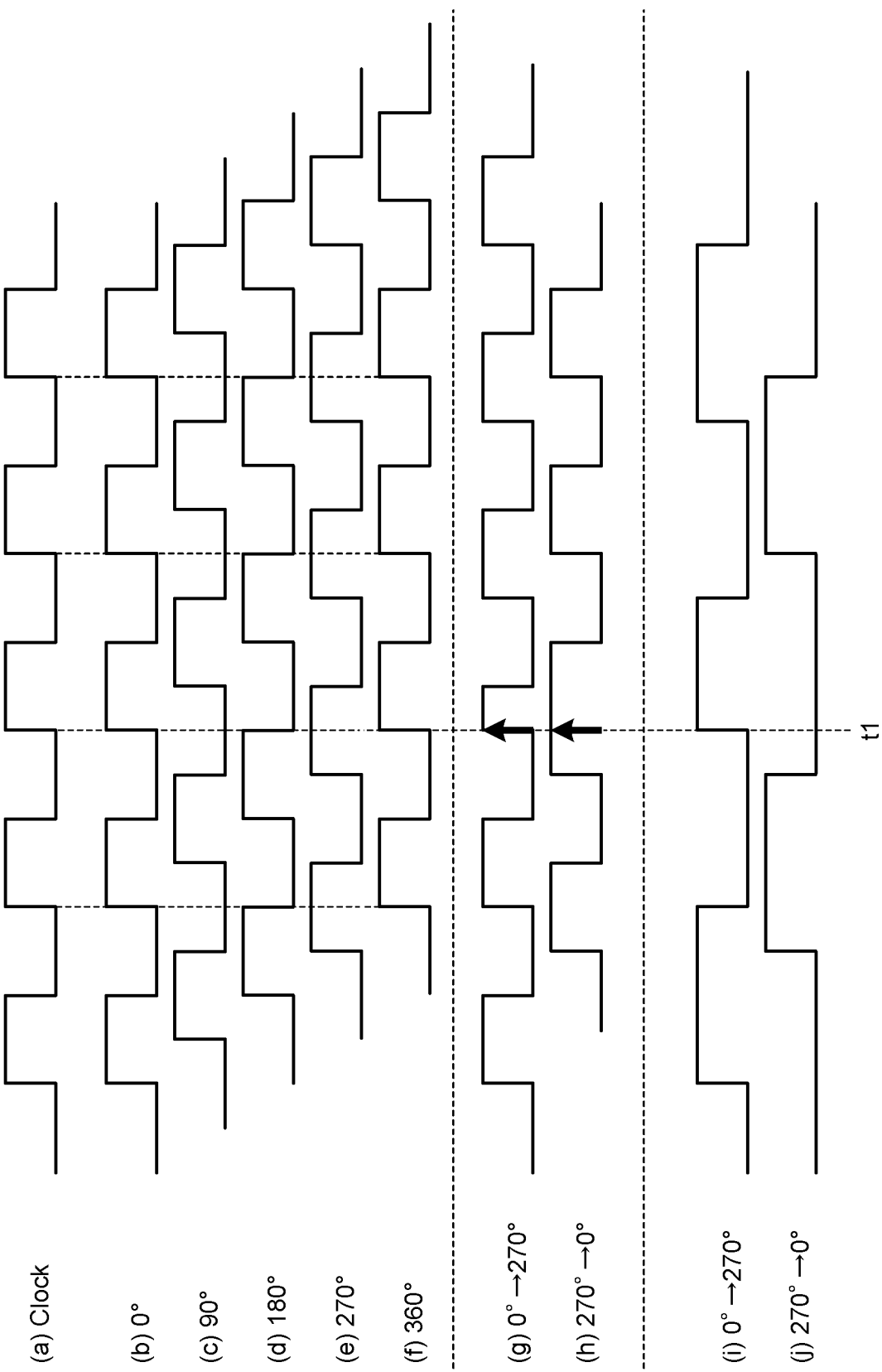
FIGS. 3A, 3B, 3C, 3D, 3E, 3F, 3G, 3H, 3I, and 3J are diagrams illustrating switching of a shift phase amount of a phase shift signal of a DLL circuit.

When a clock signal having a duty ratio of 50% as illustrated in FIG. 3A is input to the DLL circuit 110A, a delayed signal is output from the TAP of each voltage control delay circuit 114_n of the phase delay circuit 114. In this case, as illustrated in FIGS. 3B, 3C, 3D, 3E, and 3F, the TAP of each of the voltage control delay circuits 114_n outputs delayed signals having a duty ratio of 50% and phases shifted to 0 degrees, 90 degrees, 180 degrees, 270 degrees, and 360 degrees, respectively.

The selection circuit 115 selects one of the delayed signals illustrated in FIGS. 3B, 3C, 3D, 3E, and 3F and outputs the selected signal as a phase shift signal. FIGS. 3G and 3H illustrate examples of the phase shift signal output from the selection circuit 115.

FIG. 3G illustrates the phase shift signal when the shift phase amount is switched from 0 degrees to 270 degrees at time t1. In this case, the selection circuit 115 outputs the delayed signal of FIG. 3B before time t1 and outputs the delayed signal of FIG. 3E on and after time t1, as the phase shift signal.

As described above, in the case of FIGS. 3A, 3B, 3C, 3D, 3E, 3F, 3G, 3H, 3I, and 3J, the duty ratio of the delayed signal is 50%. Therefore, as indicated by the arrow in FIG. 3G, an unnecessary edge is generated at time t1 at which the shift phase amount of the delayed signal is switched from 0 degrees to 270 degrees.

FIG. 3H illustrates the phase shift signal when the shift phase amount is switched from 270 degrees to 0 degrees at time t1. In this case, the selection circuit 115 outputs the delayed signal of FIG. 3E before time t1 and outputs the delayed signal of FIG. 3A on and after time t1, as the phase shift signal.

In a case where the duty ratio of the delayed signal is 50%, as indicated by the arrow in FIG. 3H, an edge supposed to occur disappears at time t1 at which the shift phase amount of the delayed signal is switched from 270 degrees to 0 degrees.

The occurrence of an unnecessary edge or the disappearance of a necessary edge leads to a state, as illustrated in FIGS. 3I and 3J, where the phase shift clock signal generated by the subsequent divider circuit 120 is a signal inverted from a desired signal.

In this manner, with the conventional DLL circuit 110A, there has been a possibility of occurrence of an unnecessary edge or the disappearance of necessary edge at the timing of switching the shift phase amount. This leads to a possibility of occurrence of a problem such as a failure in obtaining a desired signal in a subsequent circuit (for example, the divider circuit 120).

As a countermeasure, the conventional DLL circuit 110A is operated such that, for example, in the case of switching the shift phase amount, the DLL circuit 110A is reset once, then the shift phase amount is switched, and the DLL circuit 110A is restarted. This has suppressed the occurrence of unnecessary edges and the disappearance of necessary edges at the time of switching.

However, with the method of resetting and restarting the DLL circuit 110A every time the shift phase amount is switched, it takes time to restart the DLL circuit 110A, which has made it difficult to reduce the switching time of the shift phase amount.

In view of this, the present disclosure proposes a method capable of reducing the switching time of the shift phase amount, in other words, increasing the switching speed of the output signal output from the DLL circuit.

2. FIRST EMBODIMENT

<2.1. Circuit Configuration>

Figure 4:
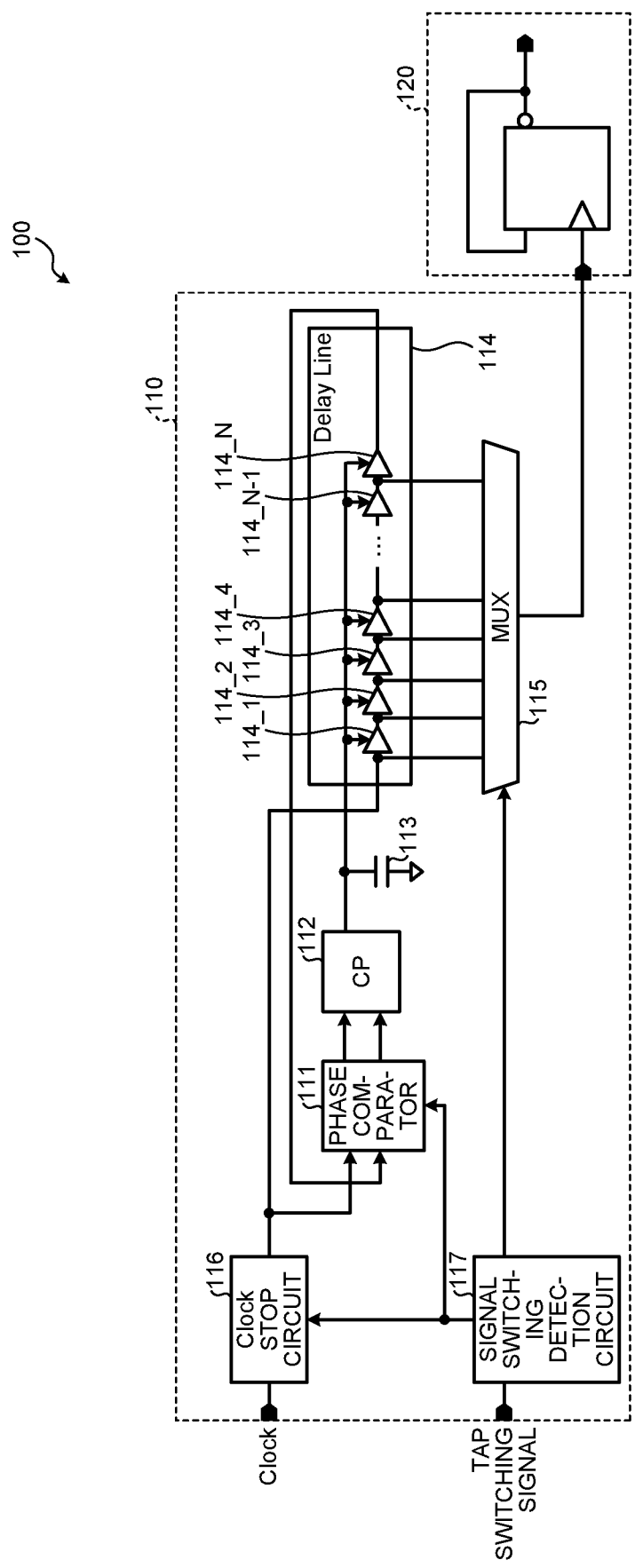
FIG. 4 is a diagram illustrating a configuration example of a signal generation circuit according to a first embodiment of the present disclosure.

A circuit configuration of a signal generation circuit 100 according to a first embodiment of the present disclosure will be described with reference to FIG. 4. FIG. 4 is a diagram illustrating a configuration example of the signal generation circuit 100 according to the first embodiment of the present disclosure. The same components as those in FIG. 1 are denoted by the same reference numerals, and the description thereof will be omitted.

The signal generation circuit 100 includes a DLL circuit 110 and a divider circuit 120, and generates a phase shift clock signal by shifting the phase of the clock signal while switching the shift phase amount according to the TAP switching signal.

The DLL circuit 110 further includes a clock stop circuit 116 and a signal switching detection circuit 117 in addition to the configuration of the DLL circuit 110A of FIG. 1.

In response to the TAP switching signal, the clock stop circuit 116 stops the clock signal such that the clock signal (an example of a reference clock signal) is not to be input to the phase delay circuit 114 or the phase comparator 111 for a predetermined period including a timing of switching the TAP. The clock stop circuit 116 stops the clock signal in response to an instruction from the signal switching detection circuit 117.

The signal switching detection circuit 117 is an example of a detection circuit, and detects the timing of switching the TAP. The signal switching detection circuit 117 detects a timing of switching the TAP based on the TAP switching signal, and outputs a clock stop signal instructing to stop the clock signal for a predetermined period to the clock stop circuit 116.

When having detected the TAP switching timing according to the TAP switching signal, the signal switching detection circuit 117 switches a TAP selection signal (an example of a setting signal) to switch the TAP that outputs a delayed signal (an example of a delay clock signal) generated by the phase delay circuit 114.

Figure 5:
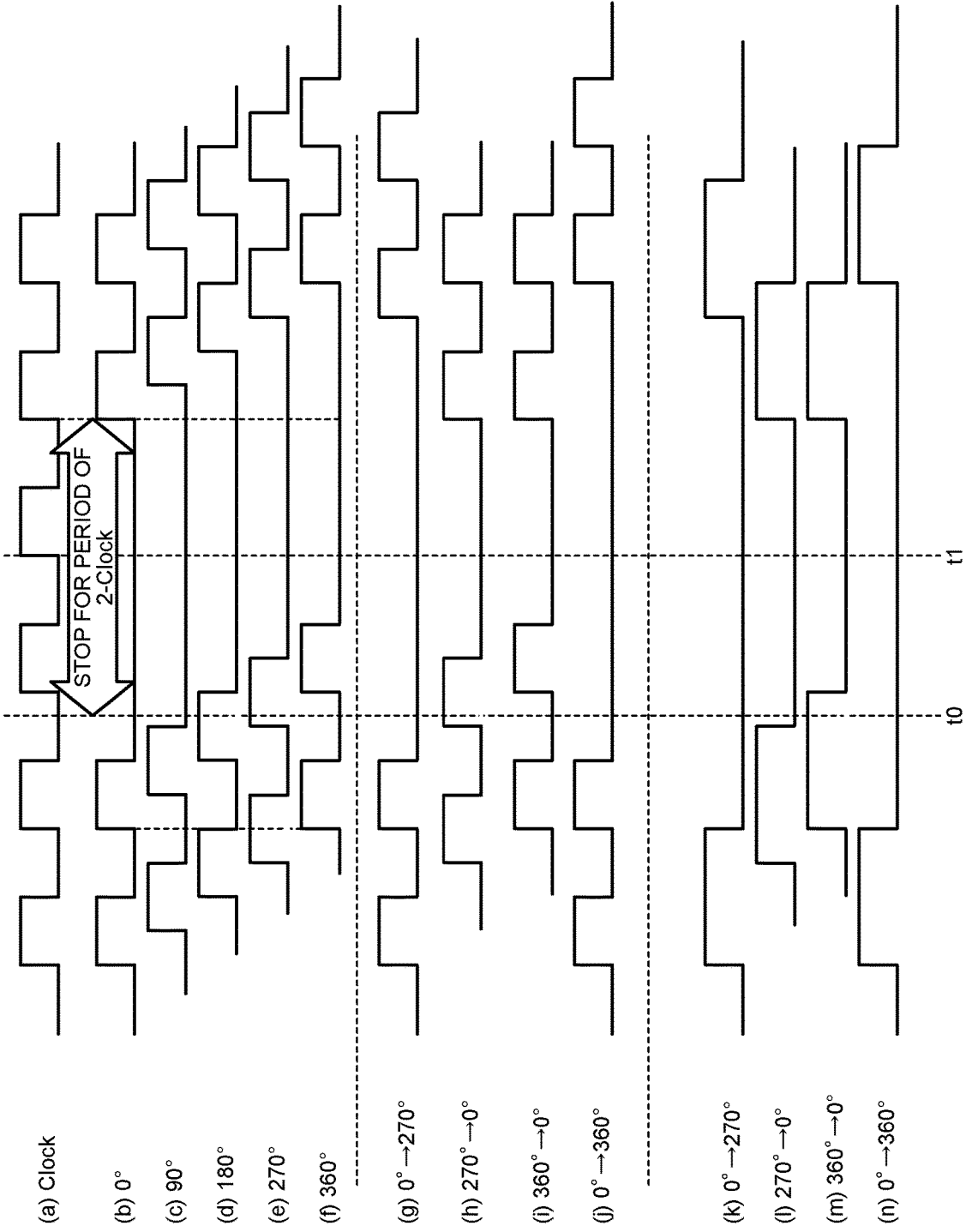
FIGS. 5A, 5B, 5C, 5D, 5E, 5F, 5G, 5H, 5I, 5J, 5K, 5L, 5M, and 5N are diagrams illustrating stop of a clock signal by a clock stop circuit according to the first embodiment of the present disclosure.

Here, the timing at which the clock stop circuit 116 stops the clock signal will be described with reference to FIG. 5. FIG. 5 is a diagram illustrating stop of the clock signal by the clock stop circuit 116 according to the first embodiment of the present disclosure.

In FIGS. 5A, 5B, 5C, 5D, 5E, 5F, 5G, 5H, 5I, 5J, 5K, 5L, 5M, and 5N, it is assumed that the signal switching detection circuit 117 detects TAP switching at time t0 and performs TAP switching at time t1.

As illustrated in FIG. 5A, for example, a clock signal having a duty ratio of 50% is input to the DLL circuit 110. As illustrated in FIGS. 5B, 5C, 5D, 5E, and 5F, the TAP of each voltage control delay circuit 114_n outputs delayed signals having a duty ratio of 50% and phases shifted to 0 degrees, 90 degrees, 180 degrees, 270 degrees, and 360 degrees, respectively.

As described above, when the signal switching detection circuit 117 has detected the switching of TAP at time t0, the clock stop circuit 116 stops the clock signal for a predetermined period (a period of 2-clock in FIGS. 5A, 5B, 5C, 5D, 5E, 5F, 5G, 5H, 5I, 5J, 5K, 5L, 5M, and 5N) after the detection.

With this operation, as illustrated in FIGS. 5B, 5C, 5D, 5E, and 5F, to 5(f), the delayed signal is not output from each TAP after the delay according to each shift phase amount after the clock signal stops. When a period of 2-clock elapses after the clock signal stops, the delayed signal is output again after the delay according to each shift phase amount.

The selection circuit 115 selects one of the delayed signals illustrated in FIGS. 5B, 5C, 5D, 5E, and 5F, in accordance with an instruction from the signal switching detection circuit 117, and outputs the selected delayed signal as a phase shift signal. FIGS. 5G and 5H illustrate examples of the phase shift signals output from the selection circuit 115.

FIG. 5G illustrates the phase shift signal when the shift phase amount is switched from 0 degrees to 270 degrees at time t1. In this case, the selection circuit 115 outputs the delayed signal of FIG. 5B before time t1 and outputs the delayed signal of FIG. 5E on and after time t1, as the phase shift signal.

The delayed signals in FIGS. 5B and 5E are stopped for a period delayed by a predetermined shift phase amount from the period in which the clock signal is stopped. Therefore, as illustrated in FIG. 5G, both output of the delayed signals of FIGS. 5B and 5E are stopped at time t1 at which the shift phase amount is switched, suppressing occurrence of an unnecessary edge in the phase shift signal.

FIG. 5H illustrates the phase shift signal when the shift phase amount is switched from 270 degrees to 0 degrees at time t1. In this case, the selection circuit 115 outputs the delayed signal of FIG. 5E before time t1 and outputs the delayed signal of FIG. 5B on and after time t1 as the phase shift signal.

As described above, the delayed signals of FIGS. 5B and 5E are stopped during a period delayed by a predetermined shift phase amount from the period in which the clock signal is stopped. Therefore, as illustrated in FIG. 5G, both output of the delayed signals of FIGS. 5B and 5E are stopped at time t1 at which the shift phase amount is switched, naturally suppressing occurrence of an edge in the phase shift signal. Therefore, there is no disappearance of an edge to be generated in the phase shift signal.

In this manner, the clock stop circuit 116 stops the clock signal for a predetermined period including the TAP switching timing. This makes it possible to suppress occurrence of unnecessary edges in the phase shift signal or disappearance of necessary edges.

Therefore, as illustrated in FIGS. 5K and 5L, it is possible to output a desired signal from the divider circuit 120 without inverting the phase shift clock signal.

In addition, as illustrated in FIGS. 5B and 5F, the delayed signals having the shift phase amounts of 0 degrees and 360 degrees have the same rise and fall timings, but have different periods in which output is stopped.

Therefore, as illustrated in FIGS. 5I and 5J, the phase shift signal output from the selection circuit 115 is different between a case where the shift phase amount is switched from 360 degrees to 0 degrees and a case where the shift phase amount is switched from 0 degrees to 360 degrees. More specifically, there is a difference in the periods during which output of the phase shift signal is stopped. FIG. 5I illustrates the phase shift signal when the shift phase amount is switched from 360 degrees to 0 degrees; FIG. 5J illustrates the phase shift signal when the shift phase amount is switched from 0 degrees to 360 degrees. As illustrated in FIGS. 5I and 5J, the output stop period is longer in the case where the shift phase amount is switched from 0 degrees to 360 degrees than in the case where the shift phase amount is switched from 360 degrees to 0 degrees.

FIGS. 5M and 5N illustrate phase shift clock signals obtained by dividing the phase shift signals illustrated in FIGS. 5I and 5J by two, respectively. In the examples illustrated in FIGS. 5M and 5N, phase shift clock signals are mutually inverted between the case where the shift phase amount is switched from 360 degrees to 0 degrees and the case where the shift phase amount is switched from 0 degrees to 360 degrees.

In this manner, by the operation in which the clock stop circuit 116 stops the clock signal for a predetermined period including the TAP switching timing, it is possible to distinguish between the case where the shift phase amount is switched from 0 degrees to 360 degrees and the case where the shift phase amount is switched from 360 degrees to 0 degrees.

Figure 6:
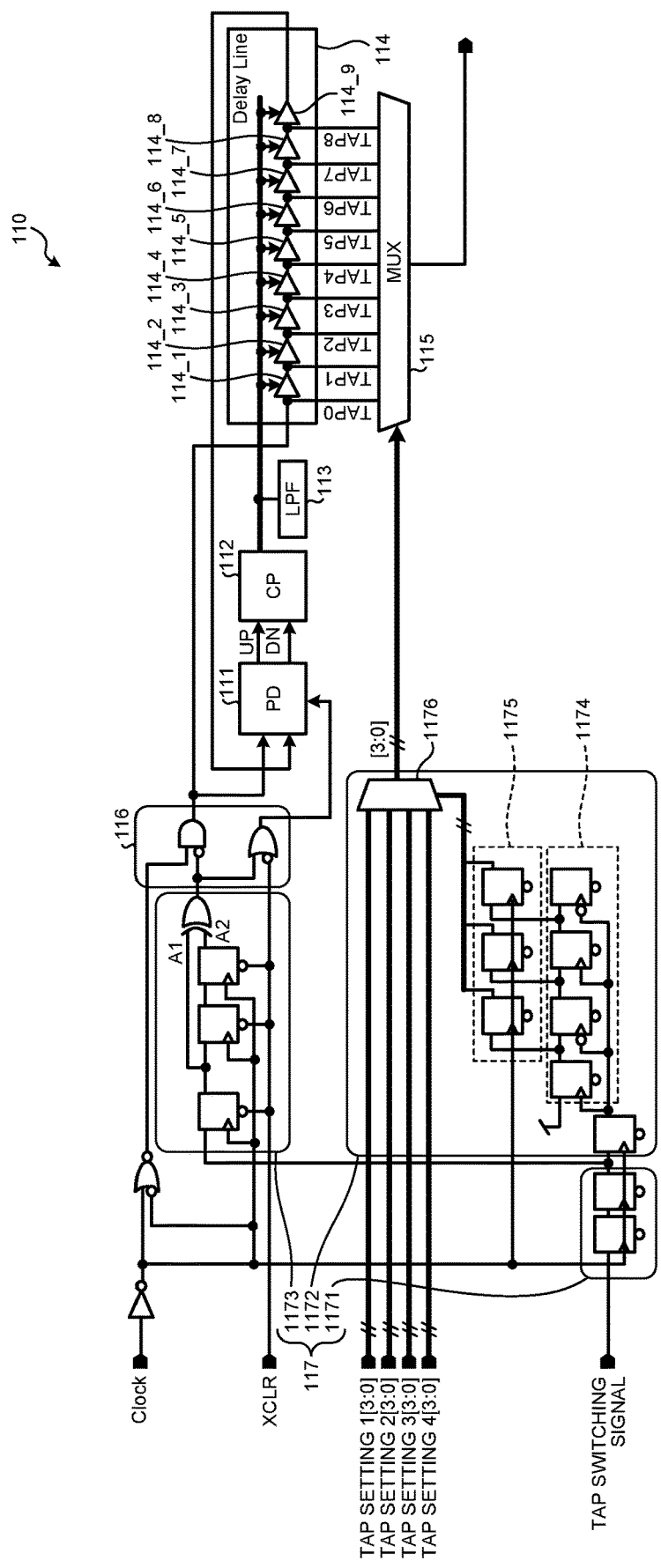
FIG. 6 is a diagram illustrating a configuration example of a DLL circuit according to the first embodiment of the present disclosure.

Next, details of the clock stop circuit 116 and the signal switching detection circuit 117 according to the first embodiment of the present disclosure will be described with reference to FIG. 6. FIG. 6 is a diagram illustrating a configuration example of the DLL circuit 110 according to the first embodiment of the present disclosure.

In accordance with the clock stop signal output from the signal switching detection circuit 117, the clock stop circuit 116 of the DLL circuit 110 outputs or stops the clock signal (an example of the reference clock signal) input to the DLL circuit 110. In addition, the clock stop circuit 116 generates a PD control signal for stopping the operation of the phase comparator 111 in response to the clock stop signal.

In the example illustrated in FIG. 6, the clock stop circuit 116 includes an AND gate circuit and an OR gate circuit as logic gate circuits.

A clock signal and a signal obtained by inverting the clock stop signal are input to the AND gate circuit. With this operation, the clock stop circuit 116 stops the clock signal by outputting the Low signal regardless of the clock signal during the clock stop period.

A clock stop signal and a signal obtained by inverting a reset (XCLR) signal are input to the OR gate circuit. The clock stop circuit 116 outputs, from the OR gate circuit, a PD control signal for stopping the operation of the phase comparator 111 during the clock stop period.

The signal switching detection circuit 117 includes a synchronization circuit 1171, a switching circuit 1172, and a stop control circuit 1173.

The synchronization circuit 1171 is a circuit provided for suppressing of occurrence of metastability in the switching circuit 1172 and the stop control circuit 1173. In the example of FIG. 6, the synchronization circuit 1171 includes two stages of flip-flops. The synchronization circuit 1171 in FIG. 6 is an example, and the circuit can be arbitrarily configured as long as it is a circuit for avoiding a metastability in a subsequent flip-flop.

The switching circuit 1172 includes a first flip-flop group 1174, a second flip-flop group 1175, and a selection circuit 1176. The switching circuit 1172 sequentially switches the plurality of TAP settings according to the TAP switching signal and outputs a signal as a TAP selection signal, thereby switching the delayed signal output from the DLL circuit 110.

The first flip-flop group 1174 includes a plurality of flip-flops connected in multiple stages. In FIG. 6, the first flip-flop group 1174 includes four stages of flip-flops.

The output signal from the synchronization circuit 1171 is input, via the flip-flops, to the clock input terminals of the odd-numbered flip-flops, out of the clock input terminals of the first flip-flop group 1174. In addition, a signal obtained by inverting the output signal of the synchronization circuit 1171 via the flip-flop is input to the clock input terminal of the even-numbered stage flip-flop.

The input terminals of the flip-flops of the second and subsequent stages of the first flip-flop group 1174 are connected to the output terminals of the flip-flops of the previous stage. A signal of a predetermined voltage is applied to an input terminal of a first-stage flip-flop.

The second flip-flop group 1175 includes a plurality of flip-flops. In FIG. 6, the second flip-flop group 1175 includes three flip-flops.

The clock signal is input to the clock input terminals of the plurality of flip-flops included in the second flip-flop group 1175 via the NOT gate circuit. Furthermore, the input terminals of the plurality of flip-flops are connected to the output terminals of the flip-flops of the first flip-flop group 1174, and the output signals of the individual stages of the first flip-flop group 1174 are input to the input terminal. The output signals of the plurality of flip-flops included in the second flip-flop group 1175 are input to the selection circuit 1176.

Based on the signal input from the second flip-flop group 1175, the selection circuit 1176 selects and outputs one of the plurality of TAP settings (four TAP settings 1 to 4 in the example of FIG. 6) in response to the rise or fall of the TAP switching signal.

It is assumed that the plurality of TAP settings 1 to 4 are stored in, for example, a register (not illustrated) or the like. The selection circuit 1176 sequentially switches and outputs the TAP settings 1 to 4 stored in the register based on a signal input from the second flip-flop group 1175. With this operation, TAP switching is performed, and the delayed signal output from the DLL circuit 110 is switched.

Next, the stop control circuit 1173 detects the TAP switching timing based on the TAP switching signal. The stop control circuit 1173 inputs the clock stop signal to the clock stop circuit 116 so as to stop the input of the clock signal for a predetermined period including the detected timing. The stop control circuit 1173 includes a plurality of flip-flops (three stages in FIG. 6) connected in multiple stages and an XOR gate circuit as a logic gate circuit.

The clock signal is input to the clock input terminals of the plurality of flip-flops via the NOT gate circuit. The input terminals of the flip-flops of the second and subsequent stages are connected to the output terminals of the flip-flops of the previous stage. An output signal of the synchronization circuit 1171 is input to an input terminal of the first-stage flip-flop.

The output signal of the flip-flop at the last stage and the output signal of the flip-flop at the last stage are input to the XOR gate circuit. The output signal of the XOR gate circuit is input to the clock stop circuit 116 as a clock stop signal.

An example of a clock stop signal generated by the stop control circuit 1173 will be described with reference to FIGS. 7A, 7B, 7C, 7D, 7E, and 7F. FIGS. 7A, 7B, 7C, 7D, 7E, and 7F are diagrams illustrating an example of a clock stop signal according to an embodiment of the present disclosure.

Figure 7:
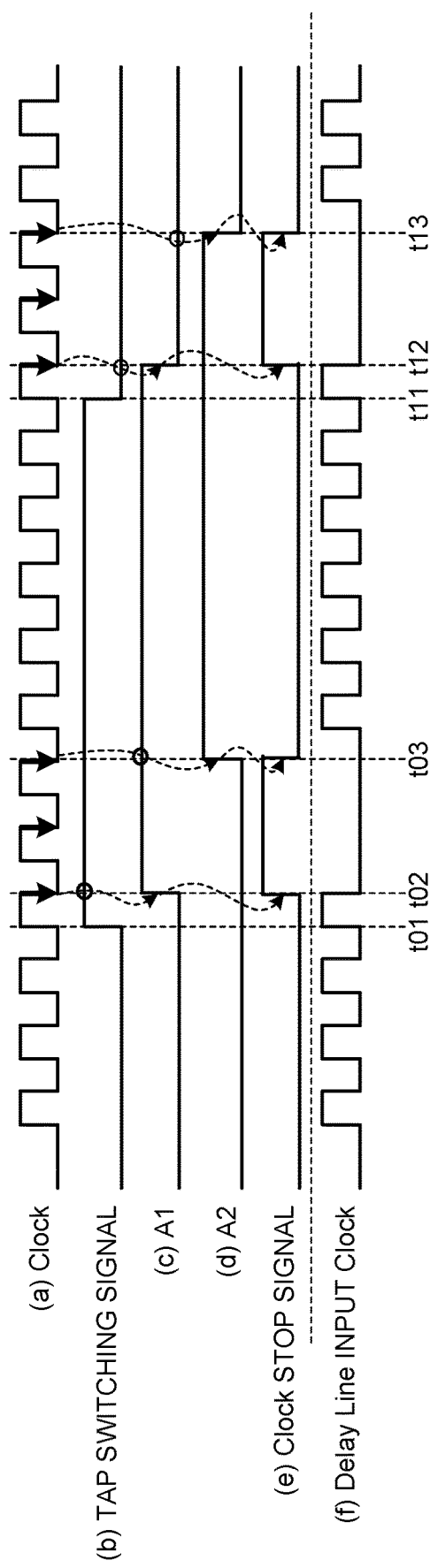
FIGS. 7A, 7B, 7C, 7D, 7E, and 7F are diagrams illustrating an example of a clock stop signal according to the embodiment of the present disclosure.

FIG. 7A illustrates a clock signal input to the DLL circuit 110. Since the clock signal is input to the stop control circuit 1173 via the NOT gate circuit (refer to FIG. 6), a signal obtained by inverting the clock signal illustrated in FIG. 7A is input to the stop control circuit 1173.

FIG. 7B illustrates a TAP switching signal to be input to the stop control circuit 1173. The TAP switching signal is input to the stop control circuit 1173 via the synchronization circuit 1171 (refer to FIG. 6). The TAP switching signal illustrated in FIG. 7B is switched from Low to High (rise) at time t01, and is switched from High to Low (fall) at time tn.

FIG. 7C illustrates a first-stage output signal output from the first-stage flip-flop among the plurality of stages of flip-flops included in the stop control circuit 1173 (refer to A1 in FIG. 6). FIG. 7D illustrates a last-stage output signal output from the last-stage flip-flop among the flip-flops of the plurality of stages included in the stop control circuit 1173 (refer to A2 in FIG. 6).

As illustrated in FIG. 7C, the first-stage output signal is switched from Low to High at timing (next fall, time t02) at which the clock signal is switched to Low, which is a next timing following time t01 when the TAP switching signal is switched from Low to High.

In addition, the first-stage output signal is switched from High to Low at timing (next fall, time t12) at which the clock signal is switched to Low, which is a timing next to time t11 when the TAP switching signal is switched from High to Low.

Subsequently, the last-stage output signal is switched from Low to High and from Low to High with a delay of a period of 2-clock from the first-stage output signal. Accordingly, as illustrated in FIG. 7D, the last-stage output signal is switched from Low to High at time t03, and then is switched from High to Low at time t13.

The first-stage output signal and the last-stage output signal are input to the XOR gate circuit of the stop control circuit 1173. As illustrated in FIG. 7E, the XOR gate circuit outputs, as the clock stop signal, a signal that becomes High in a period from time t02 to time t03 and from time t12 to time t13 and becomes Low in other periods.

The clock stop circuit 116 stops outputting the clock signal and outputs the Low signal while the clock stop signal is High. With this operation, as illustrated in FIG. 7F, the clock signal that becomes Low during the clock stop period is input to the phase delay circuit 114 (delay line).

<2.2. Switching Operation>

Figure 8:
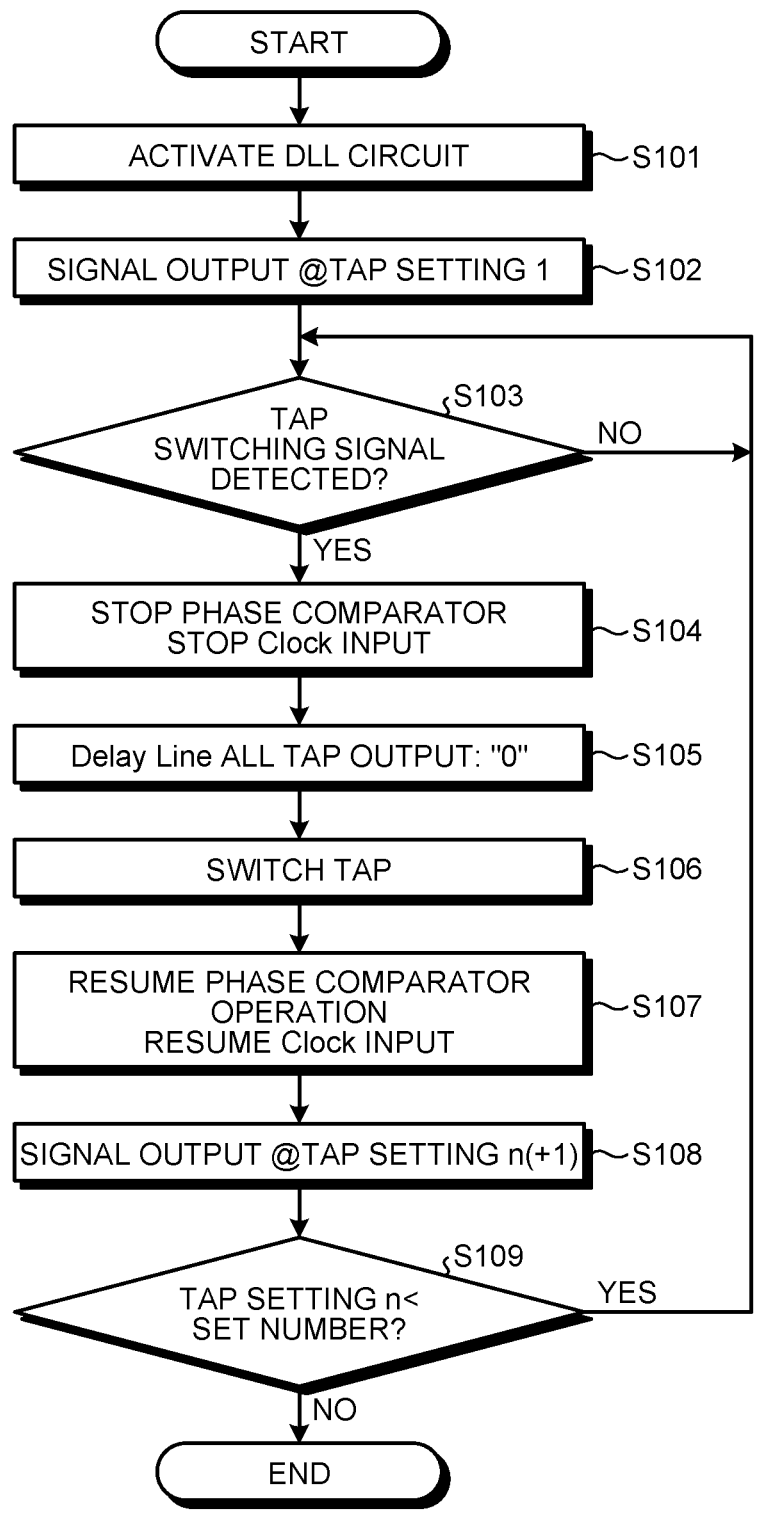
FIG. 8 is a flowchart illustrating an operation example of the DLL circuit according to the first embodiment of the present disclosure.

Next, the operation of the DLL circuit 110 will be described with reference to FIG. 8. FIG. 8 is a flowchart illustrating an operation example of the DLL circuit 110 according to the first embodiment of the present disclosure.

As illustrated in FIG. 8, when the DLL circuit 110 is activated (step S101), TAP setting 1 (refer to FIG. 6) is first selected as a signal output from the DLL circuit 110 (step S102).

Next, the DLL circuit 110 determines whether or not a TAP switching signal has been detected (step S103).

Specifically, the DLL circuit 110 detects the TAP switching signal at an edge where High and Low of the input TAP switching signal are switched.

When the DLL circuit 110 has not detected the TAP switching signal (step S103; No), that is, when the edge of the TAP switching signal has not been detected, the processing returns to step S103.

In contrast, the DLL circuit 110 has detected the TAP switching signal (step S103; Yes), that is, when the edge of the TAP switching signal has been detected, the DLL circuit 110 stops the operation of the phase comparator 111 and stops the input of the clock signal (step S104). With this operation, the signals output from all the TAPs of the phase delay circuit 114 (delay line) become "0" (Low) (step S105).

During this time, the DLL circuit 110 switches the TAP that outputs the delayed signal (step S106), resumes the operation of the phase comparator 111, and resumes the input of the clock signal (step S109). With this operation, as the signal output from the DLL circuit 110, a TAP setting obtained by incrementing n by one is selected as the next TAP setting n (step S108).

The DLL circuit 110 determines whether the number of times the TAP setting has been switched (TAP setting) is smaller than the number to be set (setting number) (step S109). In a case where the TAP setting is smaller than the setting number (step S109; Yes), the processing returns to step S103, and in a case where the TAP setting is the setting number or less (step S109; No), the DLL circuit 110 ends the TAP switching processing.

Although this is a case of ending the TAP switching processing when the TAP setting n is the setting number or more in step S109, the operation is not limited thereto. In a case where the number of TAP settings is the setting number or more, the processing may return to step S102, and the DLL circuit 110 may repeatedly switch the TAP settings.

Figure 9:
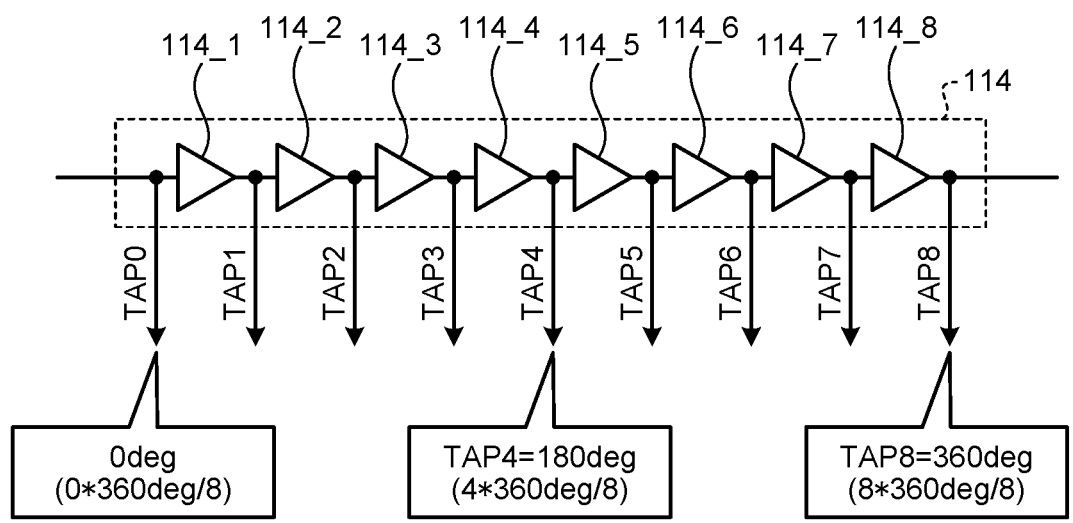
FIG. 9 is a diagram illustrating an example of a TAP in a phase delay circuit according to the first embodiment of the present disclosure.
Figure 10:
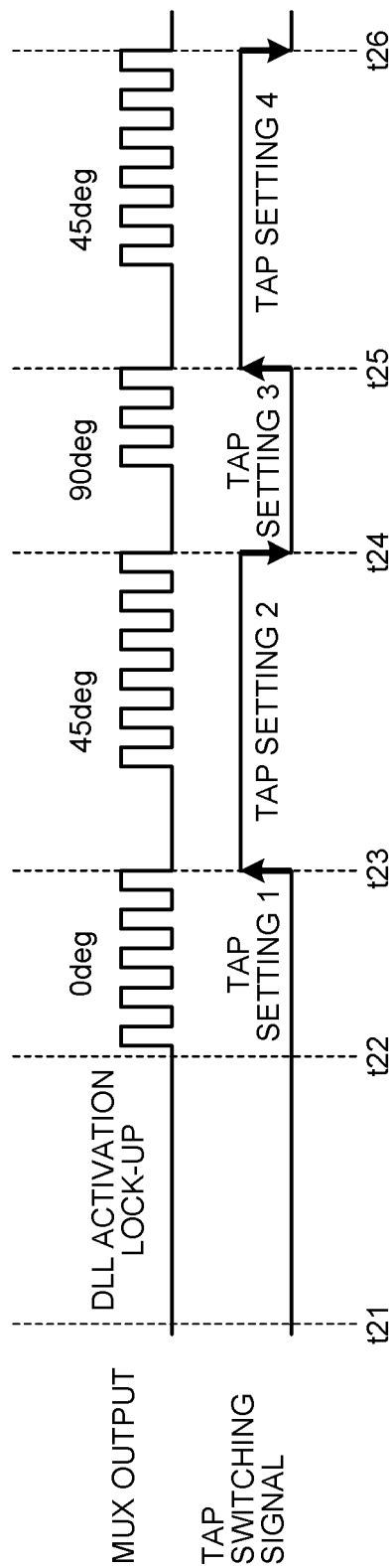
FIG. 10 is a timing chart illustrating an example of a TAP switching operation according to the first embodiment of the present disclosure.

Next, an example of a TAP switching operation by the DLL circuit 110 will be described with reference to FIGS. 9 and 10. FIG. 9 is a diagram illustrating an example of a TAP of the phase delay circuit 114 according to the first embodiment of the present disclosure. FIG. 10 is a timing chart illustrating an example of TAP switching operation according to the first embodiment of the present disclosure.

Here, as illustrated in FIG. 9, it is assumed that the phase delay circuit 114 includes eight voltage control delay circuits 114_1 to 114_8 and outputs delayed signals from nine TAP0 to TAP8 extending from an input or an output of each of the voltage control delay circuits 114_1 to 114_8.

Each TAPk (k=0 to 8) of the phase delay circuit 114 illustrated in FIG. 9 outputs a delayed signal obtained by shifting the phase of the clock signal by k×360 degrees/8. For example, the shift phase amount of the delayed signal output from TAP0 is 0×360 degrees/8=0 degrees. The shift phase amount of the delayed signal output from TAP4 is 4×360 degrees/8=180 degrees. The shift phase amount of the delayed signal output from TAP8 is 8×360 degrees/8=360 degrees.

Here, the DLL circuit 110 performs the TAP switching operation by sequentially switching the TAP settings 1 to 4. TAP setting 1 is a TAP setting for selecting a shift phase amount of 0 degrees, that is, TAP0. TAP setting 2 is a TAP setting for selecting a shift phase amount of 45 degrees, that is, TAP1. TAP setting 3 is a TAP setting for selecting a shift phase amount of 90 degrees, that is, TAP2. TAP setting 4 is a TAP setting for selecting a shift phase amount of 45 degrees, that is, TAP1.

As illustrated in FIG. 10, the DLL circuit 110 starts activation at time t21, and first selects TAP setting 1 at time t22 after the lock-up (corresponding to steps S101 and S102 in FIG. 8). With this operation, a delayed signal having a phase delayed by 0 degrees from the clock signal is output as an output of the selection circuit 115 (MUX).

Next, when having detected that the TAP switching signal has changed from Low to High at time t23, the DLL circuit 110 stops the clock signal during the clock stop period (for a period of 2-clock in FIG. 10) to suppress input of the clock signal to the phase delay circuit 114. The DLL circuit 110 switches the TAP setting from TAP setting 1 to TAP setting 2 during the clock stop period. With this operation, a delayed signal having a phase delayed by 45 degrees from the clock signal is output as an output of the selection circuit 115 (MUX).

When having detected that the TAP switching signal has changed from Low to High at time t24, the DLL circuit 110 stops the clock signal for a clock stop period (for a period of 2-clock in FIG. 10) so as to suppress input of the clock signal to the phase delay circuit 114. The DLL circuit 110 switches the TAP setting from TAP setting 2 to TAP setting 3 during the clock stop period. With this operation, a delayed signal having a phase delayed by 90 degrees from the clock signal is output as an output of the selection circuit 115 (MUX).

When having detected that the TAP switching signal has changed from Low to High at time t25, the DLL circuit 110 stops the clock signal for a clock stop period (for a period of 2-clock in FIG. 10) so as to suppress input of the clock signal to the phase delay circuit 114. The DLL circuit 110 switches the TAP setting from the TAP setting 3 to the TAP setting 4 during the clock stop period. With this operation, a delayed signal having a phase delayed by 45 degrees from the clock signal is output as an output of the selection circuit 115 (MUX).

When having detected that the TAP switching signal has changed from High to Low at time t26, the DLL circuit 110 may return to TAP setting 1 and repeatedly perform TAP switching. Alternatively, it is also allowable to have a configuration in which, even when having detected that the TAP switching signal has changed from High to Low at time t26, the DLL circuit 110 does not perform TAP switching while holding TAP setting 4.

Although the number of TAP settings switched by the DLL circuit 110 is four, the number of TAP settings is not limited thereto. The number of TAP settings switched by the DLL circuit 110 may be three or less, or may be five or more. Furthermore, the shift phase amount corresponding to each TAP setting described above is an example, and can be flexibly set according to the number of voltage control delay circuits 114_$n$ of the phase delay circuit 114 or the TAP to be selected.

As described above, when TAP is switched, that is, when the shift phase amount of the delayed signal is switched, the DLL circuit 110 according to the first embodiment of the present disclosure stops the clock signal for a predetermined period including the switching timing. With this operation, the DLL circuit 110 can perform the TAP switching operation at a higher speed without adversely affecting the subsequent circuits (the divider circuit 120 in FIG. 4).

3. MODIFICATIONS

<3.1. First Modification>

Although the first embodiment is an example in which the DLL circuit 110 switches the TAP at the edge of the TAP switching signal, the timing of switching is not limited thereto. For example, a DLL circuit 110B may switch TAP at either the rising edge or the falling edge.

Figure 11:
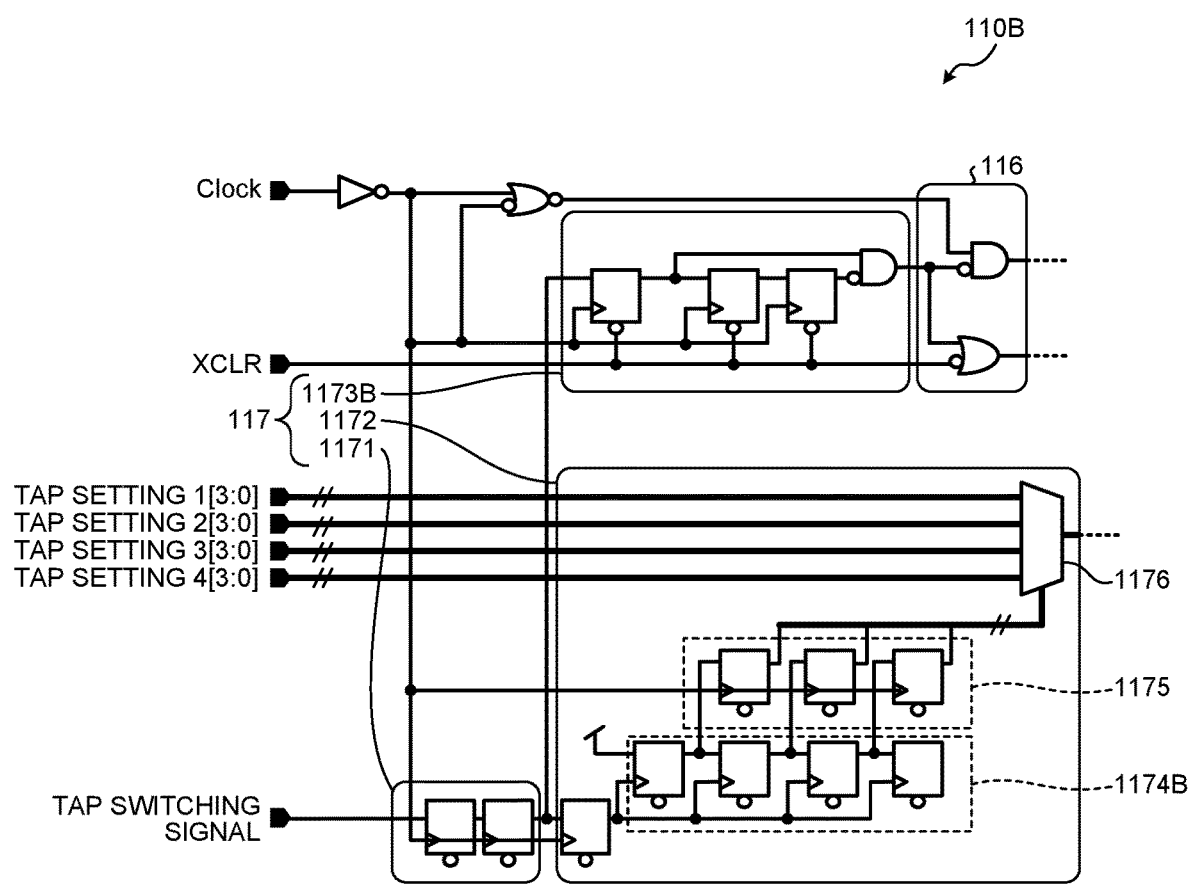
FIG. 11 is a diagram illustrating a configuration example of a DLL circuit according to a first modification of the present disclosure.

FIG. 11 is a diagram illustrating a configuration example of the DLL circuit 110B according to a first modification of the present disclosure. FIG. 11 mainly illustrates a configuration of a signal switching detection circuit 117B.

The signal switching detection circuit 117B illustrated in FIG. 11 is different from the signal switching detection circuit 117 illustrated in FIG. 6 in that a stop control circuit 1173B includes an AND gate circuit as a logic gate circuit instead of the XOR gate circuit. An output signal of the first-stage flip-flop and a signal obtained by inverting the output signal of the last-stage flip-flop are input to the AND gate circuit.

The signal switching detection circuit 117B illustrated in FIG. 11 is different from the signal switching detection circuit 117 illustrated in FIG. 6 in that the TAP switching signal is input, as a non-inverted signal, to the clock input terminals of the even-numbered flip-flops of the first flip-flop group 1174.

With this configuration, the DLL circuit 110B can switch the TAP at the rising edge of the TAP switching signal.

<3.2. Second Modification>

Although the first embodiment illustrates a case where the clock stop period during which the DLL circuit 110 stops the clock signal is set to a period of 2-clock, the stop period is not limited thereto. A DLL circuit 110C may stop the clock signal input to the phase delay circuit 114 by, for example, by a period of 1-clock, or a period of 3-clock or more.

Figure 12:
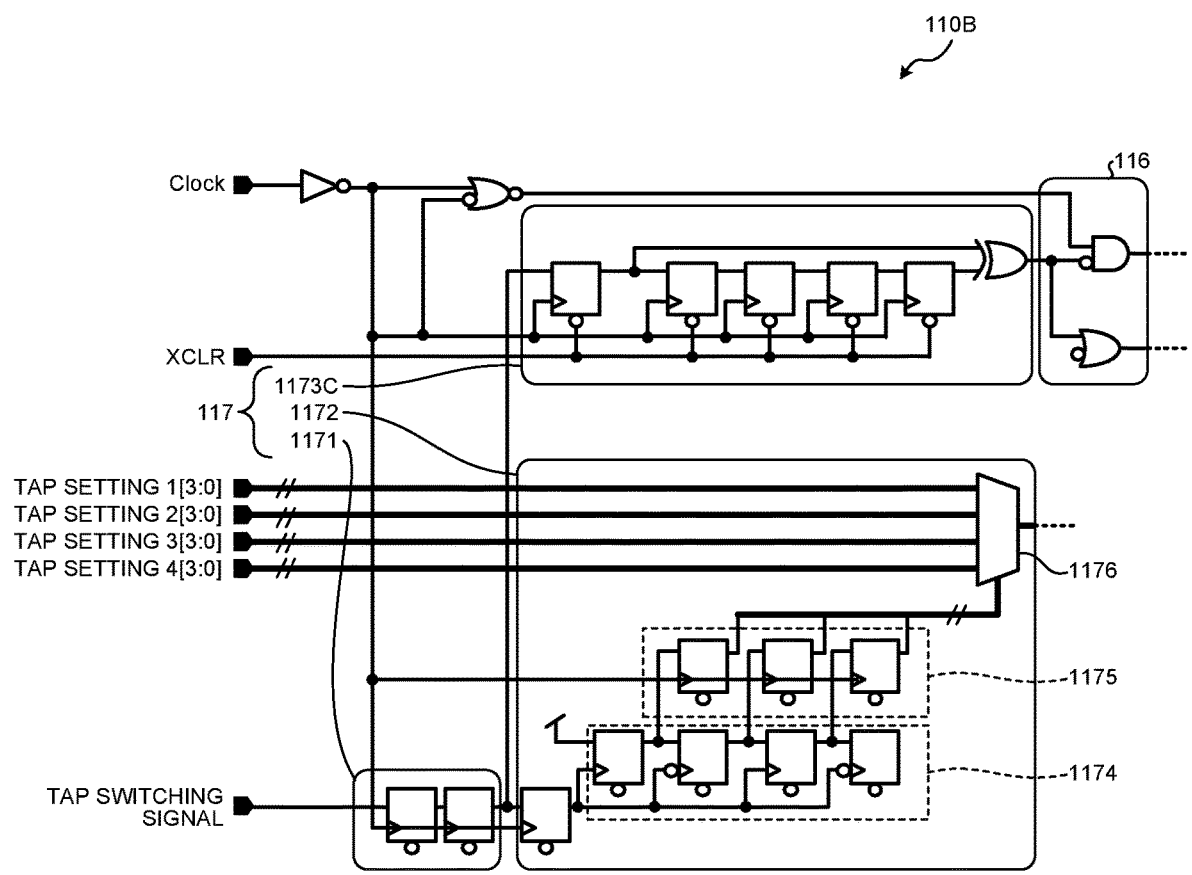
FIG. 12 is a diagram illustrating a configuration example of a DLL circuit according to a second modification of the present disclosure.

FIG. 12 is a diagram illustrating a configuration example of the DLL circuit 110C according to a second modification of the present disclosure. FIG. 12 mainly illustrates a configuration of a signal switching detection circuit 117C.

The signal switching detection circuit 117C illustrated in FIG. 12 is different from the stop control circuit 1173 illustrated in FIG. 6 in that the number of stages of flip-flops included in a stop control circuit 1173C is five.

In the example of FIG. 12, the DLL circuit 110C stops the clock signal for a period of 4-clock including the timing of switching the TAP.

In this manner, by changing the number of stages of flip-flops included in the stop control circuit 1173 C, the DLL circuit 110 C can change the clock stop period.

4. SECOND EMBODIMENT

<4.1. Schematic Configuration Example of Distance Measuring Device>

The DLL circuits 110, 110B, and 110C described in the first embodiment and its modifications can be applied as DLL circuits of a distance measuring device (an example of a distance measuring sensor), for example. Accordingly, as a second embodiment of the present disclosure, a distance measuring device including the DLL circuit 110 will be described.

Prior to the description of the second embodiment of the present disclosure, the indirect Time of Flight (ToF) method will be described as one of distance measurement methods applied to the second embodiment in order to facilitate understanding. The indirect ToF method is a technique of irradiating a measurement object with light from a light source (for example, laser light in an infrared region) modulated by, for example, pulse width modulation (PWM), receiving the reflected light by a light receiving element, and measuring a distance to the measurement object based on a phase difference in the received reflected light.

Figure 13:
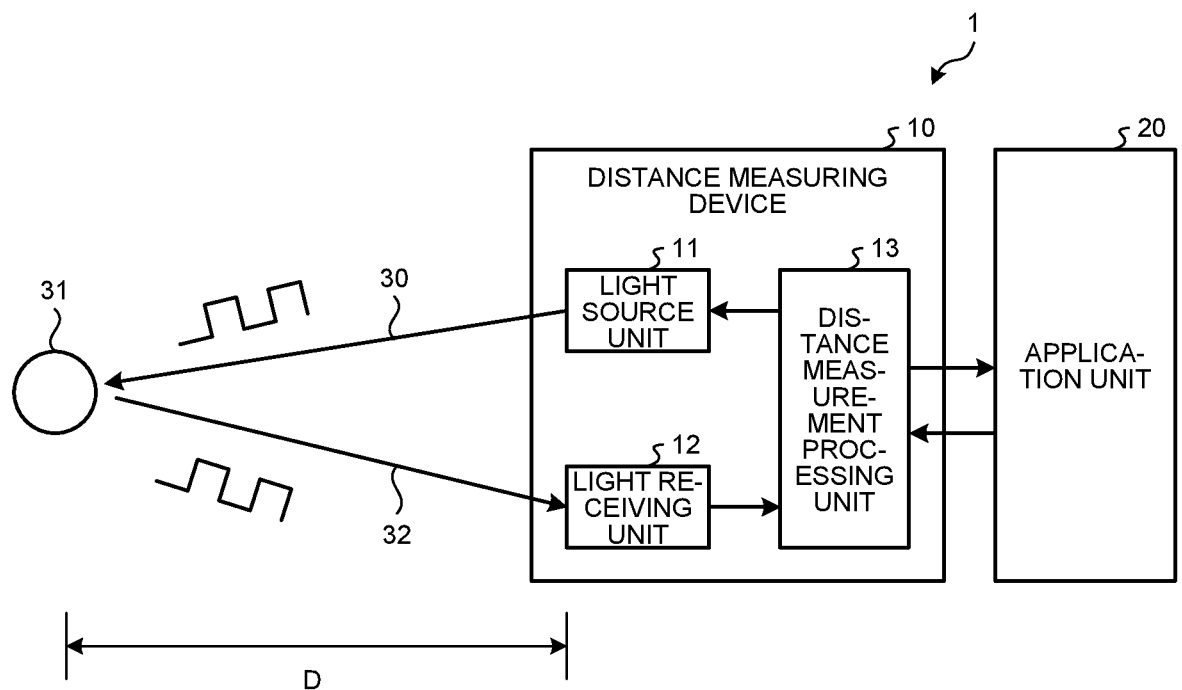
FIG. 13 is a block diagram illustrating an example of a configuration of an electronic device using the distance measuring device applied to the second embodiment of the present disclosure.

FIG. 13 is a block diagram illustrating an example of a configuration of an electronic device using the distance measuring device applied to the second embodiment of the present disclosure. In FIG. 13, an electronic device 1 includes a distance measuring device 10 and an application unit 20. The application unit 20 is implemented, for example, by a program operating on a central processing unit (CPU), requests the distance measuring device 10 to execute distance measurement, and receives from the distance measuring device 10 information such as distance information which is a result of the distance measurement.

The distance measuring device 10 includes a light source unit 11, a light receiving unit 12, and a distance measurement processing unit 13. The light source unit 11 includes: light emitting element that emits light having a wavelength in an infrared region; and a drive circuit that drives the light emitting element to emit light, for example. For example, a light emitting diode (LED) may be applied as the light emitting element included in the light source unit 11. The light emitting element is not limited thereto, and a vertical cavity surface emitting laser (VCSEL) in which a plurality of light emitting elements is formed in an array may be applied as the light emitting element included in the light source unit 11. Hereinafter, unless otherwise specified, "the light emitting element of the light source unit 11 emits light" will be described as "the light source unit 11 emits light" or the like.

The light receiving unit 12 includes: a light receiving element that detects light having a wavelength in an infrared region; and a signal processing circuit that outputs a pixel signal corresponding to the light detected by the light receiving element, for example. A photodiode may be applied as the light receiving element included in the light receiving unit 12. Hereinafter, unless otherwise specified, "the light receiving element included in the light receiving unit 12 receives light" will be described as "the light receiving unit 12 receives light" or the like.

The distance measurement processing unit 13 executes a distance measurement process in the distance measuring device 10 in response to a distance measurement instruction from the application unit 20, for example. For example, the distance measurement processing unit 13 generates a light source control signal for driving the light source unit 11 and supplies the generated light source control signal to the light source unit 11. Furthermore, the distance measurement processing unit 13 controls light reception by the light receiving unit 12 in synchronization with a light source control signal supplied to the light source unit 11. For example, the distance measurement processing unit 13 generates an exposure control signal that controls an exposure period in the light receiving unit 12 in synchronization with the light source control signal, and supplies the generated signal to the light receiving unit 12. The light receiving unit 12 outputs a valid pixel signal within the exposure period indicated by the exposure control signal.

The distance measurement processing unit 13 calculates distance information based on the pixel signal output from the light receiving unit 12 in accordance with light reception. Furthermore, the distance measurement processing unit 13 may generate predetermined image information based on the pixel signal. The distance measurement processing unit 13 passes, to the application unit 20, the distance information and the image information calculated and generated based on the pixel signal.

In such a configuration, the distance measurement processing unit 13 generates a light source control signal for driving the light source unit 11 in accordance with an instruction to execute distance measurement from the application unit 20, for example, and supplies the generated light source control signal to the light source unit 11. Here, the distance measurement processing unit 13 generates a light source control signal modulated into a rectangular wave having a predetermined duty by PWM, and supplies the light source control signal to the light source unit 11. At the same time, the distance measurement processing unit 13 controls light reception by the light receiving unit 12 based on an exposure control signal synchronized with the light source control signal.

In the distance measuring device 10, the light source unit 11 emits light modulated in accordance with the light source control signal generated by the distance measurement processing unit 13. In the example of FIG. 13, the light source unit 11 blinks based on a predetermined duty and emits light in accordance with the light source control signal. The light emitted from the light source unit 11 is projected from the light source unit 11 as projection light 30. The projection light 30 is reflected by a measurement object 31, for example, and is received by the light receiving unit 12 as reflected light 32. The light receiving unit 12 supplies a pixel signal corresponding to the reception of the reflected light 32 to the distance measurement processing unit 13.

The distance measurement processing unit 13 executes light reception by the light receiving unit 12 a plurality of times at different phases for each light receiving element. The distance measurement processing unit 13 calculates a distance D to the measurement object based on a difference between pixel signals due to light reception at different phases.

<4.2. Overview of Distance Measurement by Indirect ToF Method>

Figure 14:
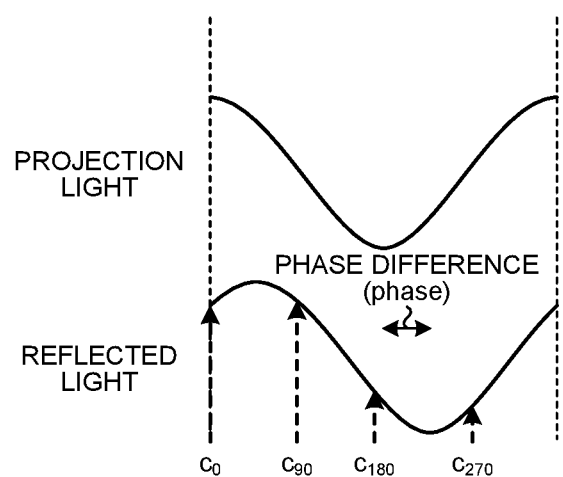
FIG. 14 is a diagram illustrating a principle of an indirect ToF method.

Next, distance measurement by the indirect ToF method applied to the second embodiment of the present disclosure will be described. FIG. 14 is a diagram illustrating the principle of the indirect ToF method. In FIG. 14, light modulated by a sine wave is used as the projection light 30 that is projected from the light source unit 11. The reflected light 32 is ideally a sine wave having a phase difference (phase) corresponding to the distance D with respect to the projection light 30.

The distance measurement processing unit 13 performs sampling a plurality of times for each of phases on the pixel signal that has occurred by reception of the reflected light 32, and acquires a light amount value (pixel signal value) indicating the light amount for each sampling. In the example of FIG. 14, light amount values C0, C90, C180, and C270 are acquired in individual phases, namely, a phase of 0 degrees, a phase of 90 degrees, a phase of 180 degrees, and a phase of 270 degrees, respectively, having a phase difference 90 degrees from each other with respect to the projection light 30. In the indirect ToF method, distance information is calculated based on a difference between light amount values of a set having phase difference 180 degrees among individual phases of 0 degrees, 90 degrees, 180 degrees, and 270 degrees.

Figure 15:
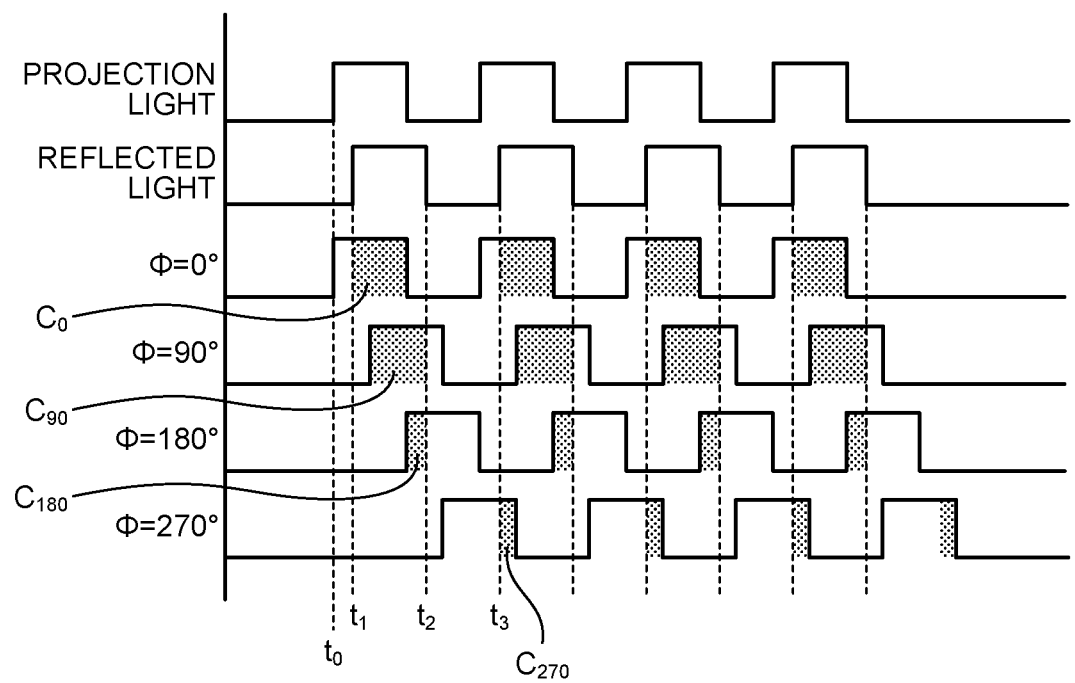
FIG. 15 is a diagram illustrating an example of a case where projection light emitted from a light source unit is a rectangular wave modulated by PWM.

A method of calculating distance information in the indirect ToF method will be described more specifically with reference to FIG. 15. FIG. 15 is a diagram illustrating an example of a case where the projection light 30 from the light source unit 11 is a rectangular wave modulated by PWM. FIG. 15 illustrates, from above, the projection light 30 from the light source unit 11 and the reflected light 32 reaching the light receiving unit 12. As illustrated in the upper part of FIG. 15, the light source unit 11 periodically blinks at a predetermined duty to allow the projection light 30 to go out.

FIG. 15 further illustrates exposure control signals at the phase 0 degrees (described as $\Phi$=0 degrees), the phase 90 degrees (described as $\Phi$=90 degrees), the phase 180 degrees (described as $\Phi$=180 degrees), and the phase 270 degrees (described as $\Phi$=270 degrees) in the light receiving unit 12. For example, a period during which the exposure control signal is in a high state is an exposure period during which the light receiving element of the light receiving unit 12 outputs a valid pixel signal.

In the example of FIG. 15, the projection light 30 is projected from the light source unit 11 at time point t0, and the reflected light 32 being reflection of the projection light 30 by the measurement object reaches the light receiving unit 12 at time point t1 after the delay corresponding to the distance D from time point t0 to the measurement object.

On the other hand, in accordance with the exposure control signal from the distance measurement processing unit 13, the light receiving unit 12 starts an exposure period with phase 0 degrees in synchronization with time point t0 of the projection timing of the projection light 30 in the light source unit 11. Similarly, the light receiving unit 12 starts exposure periods with the phase 90 degrees, the phase 180 degrees, and the phase 270 degrees in accordance with the exposure control signal from the distance measurement processing unit 13. Here, the exposure period in each phase follows the duty of the projection light 30. Although the example of FIG. 15 is an exemplary case in which the exposure periods of individual phases are temporally parallel for the sake of explanation, the light receiving unit 12 operates, in practice, such that the exposure periods of the individual phases are sequentially designated, and the light amount values C0, C90, C180, and C270 of the individual phases are acquired.

In the example of FIG. 15, the arrival timings of the reflected light 32 are time points t1, t2, t3, . . . , and the light amount value C0 at the phase 0 degrees is acquired as an integral value of the received light amount from the time point t0 to the end time point of the exposure period including the time point t0 at the phase 0 degrees. On the other hand, in the phase 180 degrees in which the phase is different from the phase 0 degrees by 180 degrees, the light amount value C180 is acquired as an integral value of the received light amount from the start time point of the exposure period at the phase 180 degrees to the time point t2 of the falling of the reflected light 32 included in the exposure period.

Also for the phase C90 and the phase 270 degrees having a phase difference 180 degrees from the phase 90 degrees, the integral value of the received light amount in the period in which the reflected light 32 arrives within each exposure period is acquired as light amount values C90 and C270, similarly to the case of the phases 0 degrees and 180 degrees described above.

Among these light amount values C0, C90, C180, and C270, as indicated in the following Formulas (1) and (2), a difference I and a difference Q are obtained based on a combination of light amount values having phase difference 180 degrees.

$$I = C0 - C180 \quad (1)$$

$$Q = C90 - C270 \quad (2)$$

Based on these differences I and Q, the phase difference (phase) is calculated by the following Formula (3). In the Formula (3), the phase difference (phase) is defined in a range of (0≤phase<2π).

$$\text{phase} = \tan^{-1}(Q/I) \quad (3)$$

Distance information Depth is calculated by the following Formula (4) using the phase difference (phase) and a predetermined coefficient (range).

$$\text{Depth} = (\text{phase} \times \text{range})/2\pi \quad (4)$$

<4.3. Overview of Proposed Technology>

As described above, the distance information Depth is calculated on the assumption that the luminance change of the irradiation light is a sine wave. However, the light emitted from the light source unit 11 is a rectangular wave in practice, as illustrated in FIG. 15. When the distance is calculated assuming a sine wave, which actually is a rectangular wave, an error occurring in a cycle (hereinafter, referred to as a cyclic error) arises in the distance information Depth.

To manage this, for example, the distance measuring device 10 according to the second embodiment of the present disclosure generates an exposure control signal (hereinafter, also referred to as a drive pulse signal) by shifting the signal to a plurality of phases in time division within one frame period, thereby approximating the irradiation light emitted as a rectangular wave to a sine wave (generating a pseudo sine wave).

Figure 16:
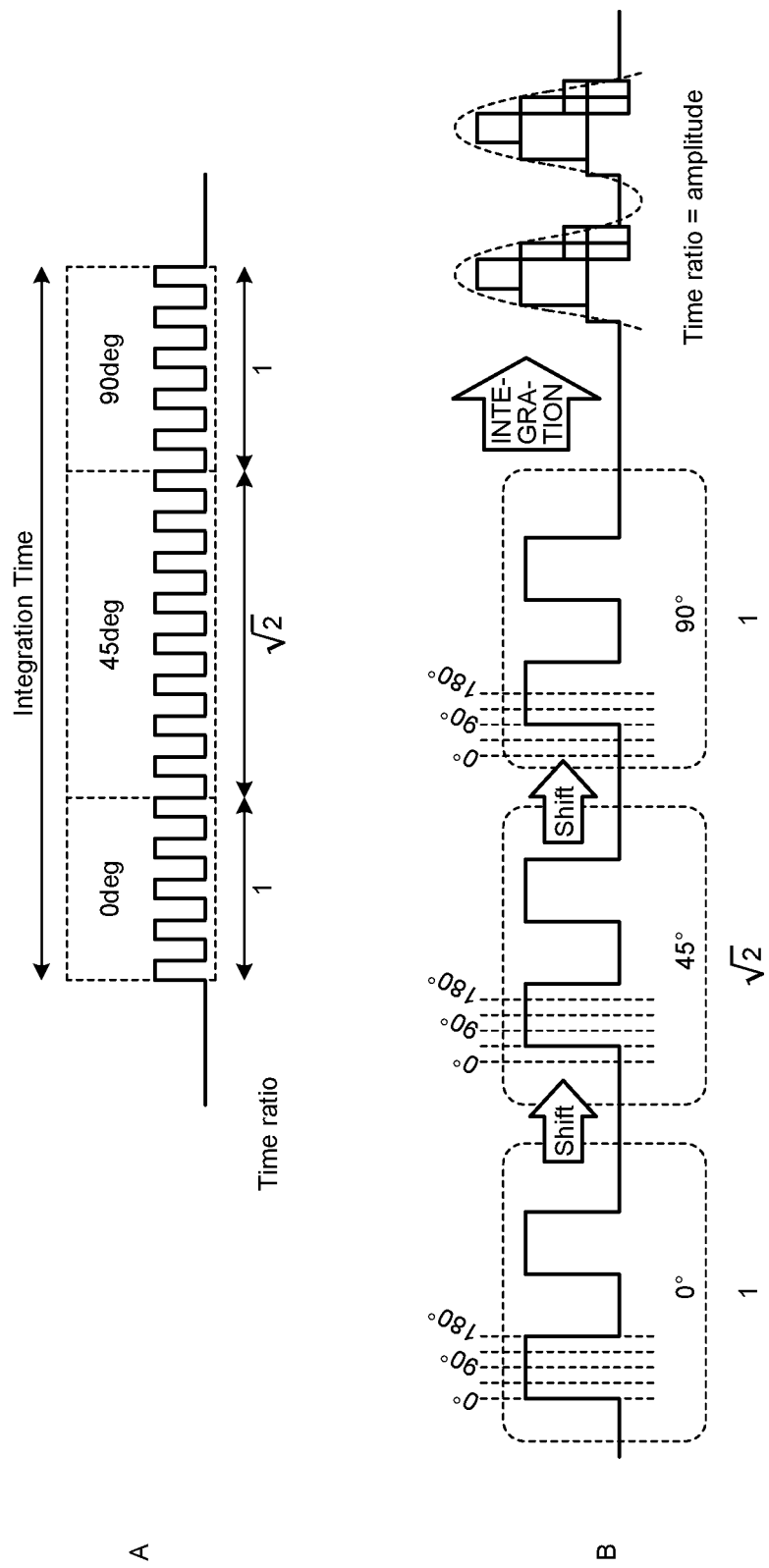
FIGS. 16A and 16B are diagrams illustrating charge accumulation time of each phase to be shifted within one frame period.

This point will be described with reference to FIGS. 16A and 16B. FIGS. 16A and 16B are diagrams illustrating charge accumulation time of each phase to be shifted within one frame period. FIGS. 16A and 16B illustrate the charge accumulation time (integrated time) at phases of 0 degrees, 45 degrees, and 90 degrees.

As illustrated in FIG. 16A, it is assumed that the phase of the drive pulse signal is shifted by 0 degrees, 45 degrees, and 90 degrees. At this time, the phase of the drive pulse signal is shifted such that the phase shifting period is 1:√2:1. That is, when the length of the period in which the phase of the drive pulse signal is shifted by 0 degrees is 1, the phase shifting periods are adjusted such that the length of the period in which the phase is shifted by 90 degrees is set to √2 and the length of the period in which the phase is shifted by 45 degrees is set to 1. With this adjustment, the ratio of the charge accumulation time (integrated time) in the phases of 0 degrees, 45 degrees, and 90 degrees will be 1:√2:1.

By setting the ratio of the charge accumulation time (integrated time) in the phases of 0 degrees, 45 degrees, and 90 degrees to 1:√2:1, the waveform of the modulated wave can be approximated to a sine wave as illustrated in FIG. 16B. In addition, by adjusting the ratio of the charge accumulation time, it is possible to adjust the amplitude of the sine wave.

At this time, by shifting the phase of the drive pulse signal using the DLL circuit 110 described above, it is possible to increase the resolution of the phase to be shifted, leading to achievement of switching the plurality of phases with higher speed.

<4.4. Configuration Example of Distance Measurement Processing Unit>

Figure 17:
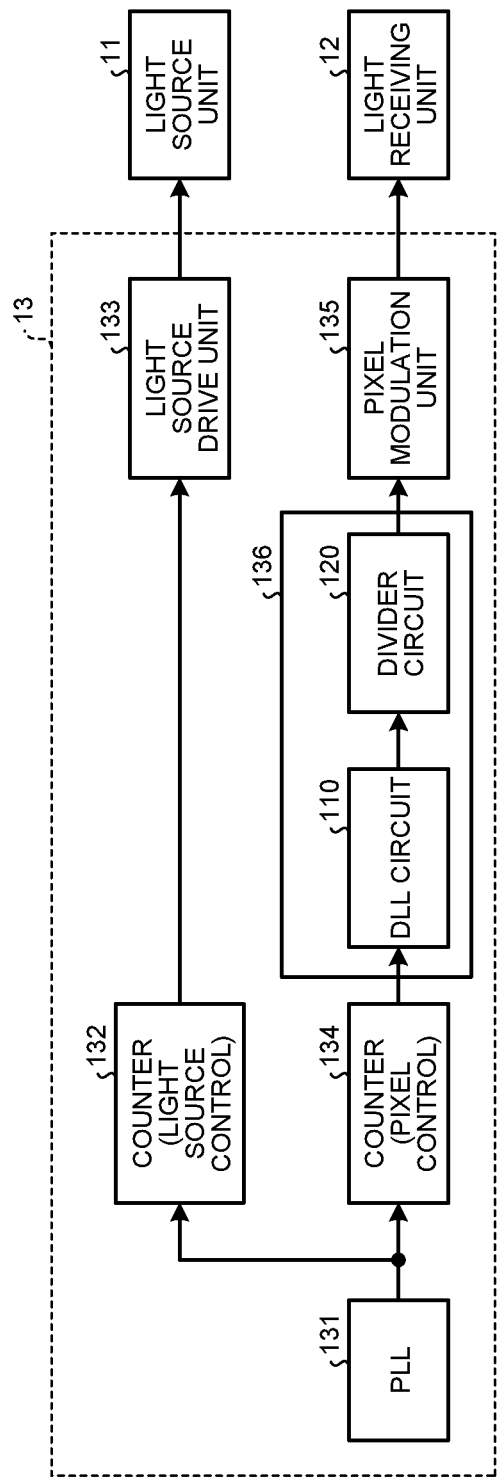
FIG. 17 is a block diagram illustrating a configuration example of a distance measurement processing unit according to the second embodiment of the present disclosure.

FIG. 17 is a block diagram illustrating a configuration example of a distance measurement processing unit 13 according to the second embodiment of the present disclosure.

As illustrated in FIG. 17, the distance measurement processing unit 13 includes a PLL circuit 131, counters 132 and 134, a light source drive unit 133, a phase shift circuit 136, and a pixel modulation unit 135.

The PLL circuit 131 generates a clock signal serving as a reference and outputs the generated clock signal to the counters 132 and 134.

The counter 132 generates a light source control signal having a predetermined frequency and phase based on the clock signal generated by the PLL circuit 131. In this manner, the counter 132 generates a light source control signal.

The light source drive unit 133 drives the light source unit 11 based on the light source control signal generated by the counter 132.

The counter 134 generates a drive pulse signal synchronized with the light source control signal based on the clock signal generated by the PLL circuit 131. At this time, the counter 134 generates a drive pulse signal having a frequency corresponding to a division ratio for dividing the drive pulse signal in the subsequent divider circuit 120. For example, the counter 134 generates a drive pulse signal by adjusting the frequency so that the divided drive pulse signal has the same frequency as the light source control signal. In addition, the counter 134 generates a drive pulse signal by adjusting the phase so as to have a predetermined phase difference from the light source control signal.

The phase shift circuit 136 includes a DLL circuit 110 and a divider circuit 120. The phase shift circuit 136 corresponds to the signal generation circuit 100 illustrated in FIG. 6, for example.

The DLL circuit 110 generates a delayed drive pulse signal obtained by shifting the drive pulse signal generated by the counter 134 to a predetermined phase, and outputs the generated signal to the divider circuit 120.

The divider circuit 120 divides the delayed drive pulse signal generated by the DLL circuit 110 at a predetermined division ratio to generate a post-division drive pulse signal (hereinafter, also referred to as a divided pulse signal).

The pixel modulation unit 135 drives each pixel based on the divided pulse signal generated by the divider circuit 120.

<4.5. Drive Pulse Signal>

Next, details of the drive pulse signal generated by the distance measurement processing unit 13 will be described. Here, as a comparative example, a distance measurement processing unit 13A that does not include the DLL circuit 110 and generates a drive pulse signal by the counter 134 will be first described.

Figure 18:
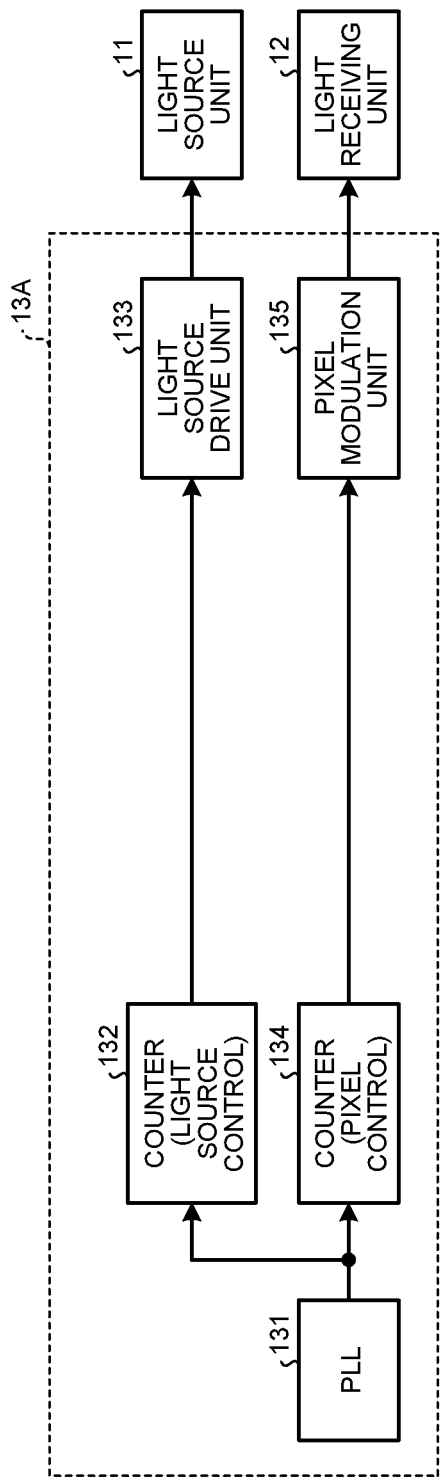
FIG. 18 is a block diagram illustrating a configuration example of a distance measurement processing unit according to a comparative example of the second embodiment of the present disclosure.

FIG. 18 is a block diagram illustrating a configuration example of the distance measurement processing unit 13A according to a comparative example of the second embodiment of the present disclosure.

As illustrated in FIG. 18, the distance measurement processing unit 13A has the same configuration as the distance measurement processing unit 13 illustrated in FIG. 17 except that the DLL circuit 110 and the divider circuit 120 are not provided.

Figure 19:
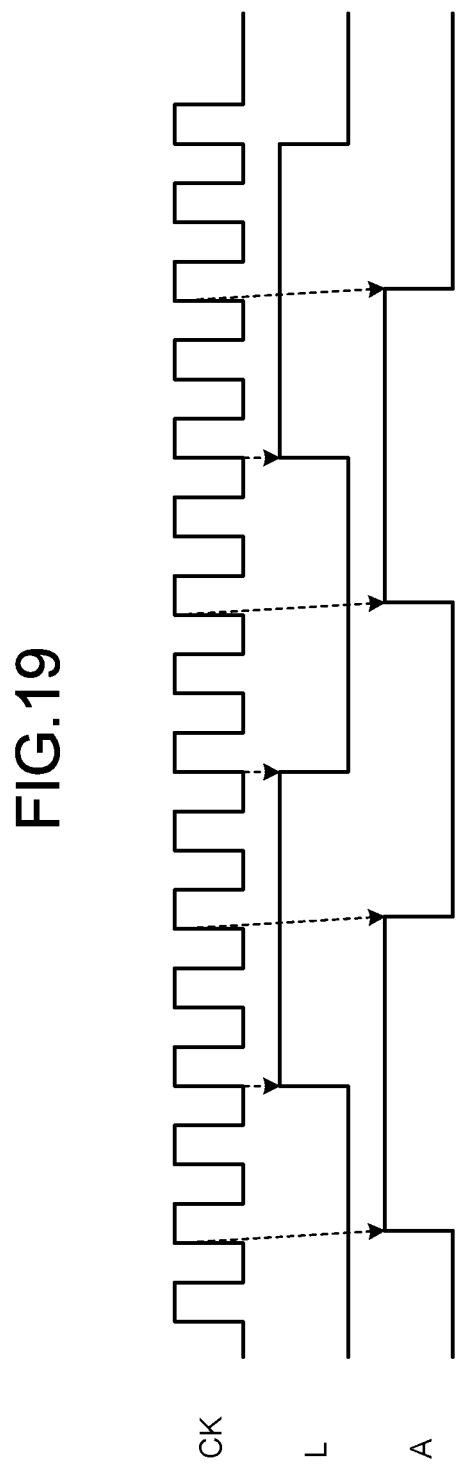
FIG. 19 is a diagram illustrating a drive pulse signal generated by the distance measurement processing unit according to the comparative example of the second embodiment of the present disclosure.

FIG. 19 is a diagram illustrating a drive pulse signal generated by the distance measurement processing unit 13A according to the comparative example of the second embodiment of the present disclosure.

The symbol CK illustrated in FIG. 19 is a clock signal CK generated by the PLL circuit 131. The counter 132 generates a light source control signal L based on the clock signal CK. In the example of FIG. 19, the counter 132 generates the light source control signal L including 8-clock components of the clock signal CK in one cycle.

Furthermore, the symbol A illustrated in FIG. 19 represents a drive pulse signal A generated by the counter 134. Based on the clock signal CK, the counter 134 generates the drive pulse signal A having the same frequency as the light source control signal L and having a predetermined phase difference from the light source control signal L.

Since the counter 134 generates the drive pulse signal A based on the clock signal CK, the phase difference between the drive pulse signal A and the light source control signal L is 1-clock (1CLK) of the clock signal CK at minimum, which means, at best.

In this manner, in the distance measurement processing unit 13A not including the DLL circuit 110, the highest-possible resolution of the phase difference between the drive pulse signal A and the light source control signal L is 1-clock.

When the phases of the drive pulse signal A and the light source control signal L are controlled only by the counters 132 and 134, the distance measurement processing unit 13A can generate the drive pulse signal A with low jitter and high phase accuracy. On the other hand, the resolution of the phase difference between the drive pulse signal A and the light source control signal L depends on the frequency of the clock signal CK, and the power consumption of the distance measurement processing unit 13A increases in proportion to the frequency of the clock signal CK and the circuit scale.

Figure 20:
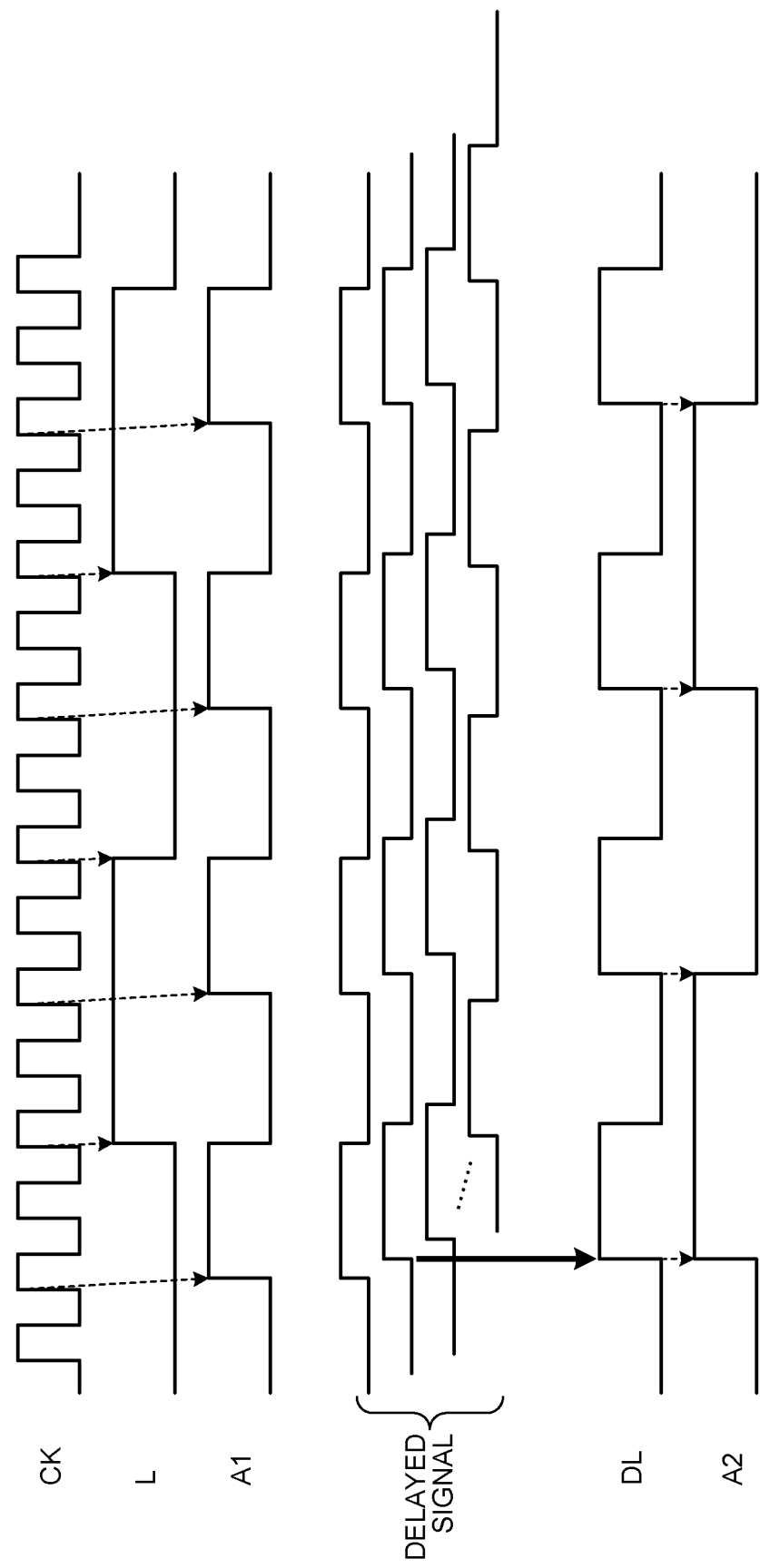
FIG. 20 is a diagram illustrating a drive pulse signal generated by a distance measurement processing unit according to a second embodiment of the present disclosure.

Next, a drive pulse signal generated by the distance measurement processing unit 13 according to the second embodiment of the present disclosure will be described. FIG. 20 is a diagram illustrating a drive pulse signal generated by the distance measurement processing unit 13 according to the second embodiment of the present disclosure. Note that the clock signal generated by the PLL circuit 131 and the light source control signal L generated by the counter 132 are the same as the clock signal CK and the light source control signal L illustrated in FIG. 19, respectively.

As illustrated in FIG. 20, the counter 134 generates a drive pulse signal A1 based on the clock signal CK. Here, assuming that the division ratio of the subsequent divider circuit 120 is 2, the counter 134 generates the drive pulse signal A1 having 4-clock components of the clock signal CK in one cycle. In addition, the counter 134 generates the drive pulse signal A1 having a predetermined phase difference from the light source control signal L.

The DLL circuit 110 delays the drive pulse signal A1 to generate a delayed drive pulse signal DL. Here, the delayed signal illustrated in FIG. 20 is a signal generated by each of the voltage control delay circuits 114_*n* (refer to FIG. 6) of the phase delay circuit 114 in the DLL circuit 110. The number of delayed signals and the delay amount are determined by the number of voltage control delay circuits 114_*n* (the number of delay stages of the DLL circuit 110).

The selection circuit 115 (refer to FIG. 6) of the DLL circuit 110 selects one of the plurality of delayed signals and outputs the selected signal as the delayed drive pulse signal DL from the DLL circuit 110. In the example of FIG. 20, the DLL circuit 110 outputs the second delayed signal from the top as the delayed drive pulse signal DL.

The divider circuit 120 divides the delayed drive pulse signal DL by two to generate a divided pulse signal A2. The divided pulse signal A2 is a signal having the same frequency as the light source control signal L.

In this manner, by delaying the drive pulse signal A1 using the DLL circuit 110, the distance measurement processing unit 13 can enhance the highest-possible resolution of the phase difference between the drive pulse signal A1 and the light source control signal L to the 1-clock resolution or higher compared with the clock signal generated by the PLL circuit 131.

The distance measurement processing unit 13 according to the second embodiment of the present disclosure controls the phase difference between the divided pulse signal A2 and the light source control signal L using the counters 132 and 134 and the DLL circuit 110. This makes it possible to drive the distance measurement processing unit 13 with lower power consumption. In addition, it is possible to allow the phase difference between the divided pulse signal A2 and the light source control signal L to have a higher resolution without depending on the clock signal CK.

Here, the resolution of the phase difference between the divided pulse signal A2 and the light source control signal L will be described in detail.

First, the highest-possible resolution for the phase difference between the drive pulse signal A and the light source control signal L generated by the distance measurement processing unit 13A according to the comparative example (also referred to as highest-possible phase resolution) is obtained by the following Formula (5).

$$\text{Highest-possible phase resolution}[°]=(\text{output frequency/input frequency})\times 360° \qquad (5)$$

Here, the input frequency is the frequency of the clock signal CK generated by the PLL circuit 131, and the output frequency is the frequency of the drive pulse signal A generated by the counter 134.

For example, when the input frequency is 1.2 GHz and the output frequency is 100 MHz, the highest-possible phase resolution is 30 degrees. Furthermore, in the distance measurement processing unit 13A, the highest-possible resolution decreases as the output frequency increases.

On the other hand, the highest-possible resolution (also referred to as the highest-possible phase resolution) of the phase difference between the divided pulse signal A2 generated by the distance measurement processing unit 13 and the light source control signal L is obtained by the following Formula (6).

$$\text{Highest-possible phase resolution}[°]=(1/\text{total number of delay stages}\times\text{division ratio})\times 360° \qquad (6)$$

Here, the total number of delay stages is the number of delay stages of the DLL circuit 110 (the number of voltage control delay circuits 114_*n* of the phase delay circuit 114), and the division ratio is the division ratio of the divider circuit 120.

For example, when the number of delay stages is 16 and the division ratio is 2, the highest phase resolution is 11.25 degrees regardless of the output frequency and the input frequency. Note that the output frequency is limited to the frequency range locked by the DLL circuit 110.

In this manner, by including the DLL circuit 110, the distance measurement processing unit 13 according to the second embodiment of the present disclosure can switch the phase of the divided pulse signal A2 at a higher speed with higher phase resolution.

Figure 21:
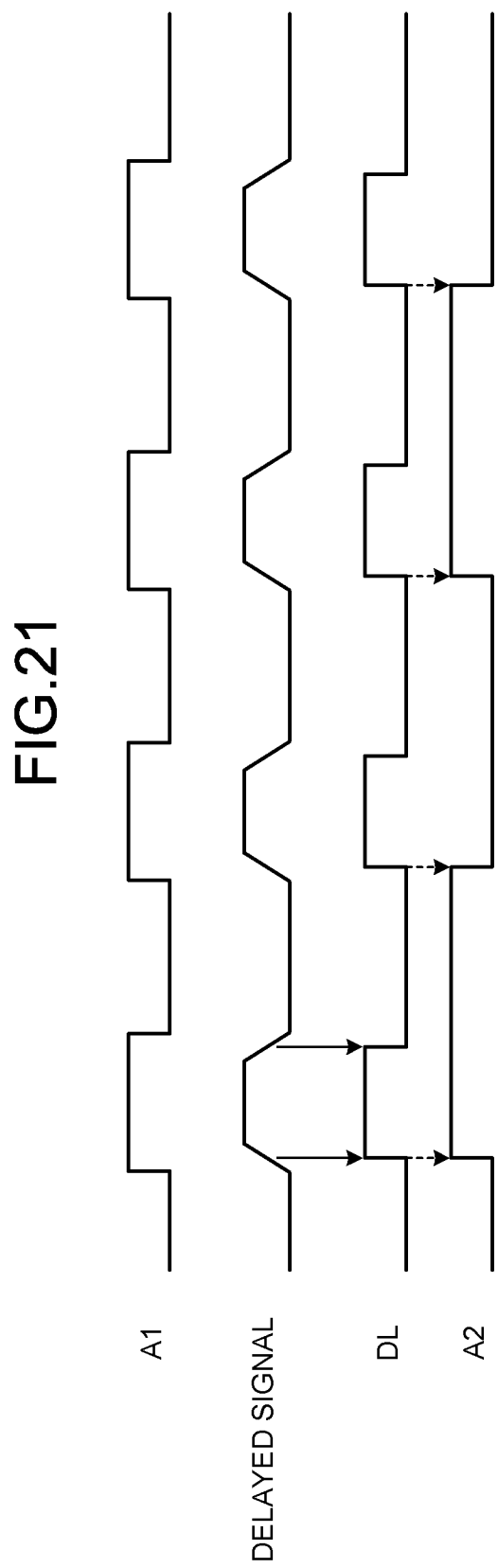
FIG. 21 is a diagram illustrating a divided pulse signal according to the second embodiment of the present disclosure.

Next, a point that the distance measurement processing unit 13 includes the divider circuit 120 will be described. FIG. 21 is a diagram illustrating a divided pulse signal A2 according to the second embodiment of the present disclosure.

The drive pulse signal A1 having a predetermined duty ratio is input to the DLL circuit 110. In the example illustrated in FIG. 21, the drive pulse signal A1 having a duty ratio of 50% is input to the DLL circuit 110.

In the DLL circuit 110, the duty quality of the delayed signal is likely to be degraded due to voltage control of the delay amount.

Since the DLL circuit 110 generates a delayed signal by voltage control, it is susceptible to variations in threshold voltage of a transistor (not illustrated) included in the DLL circuit 110, and as illustrated in FIG. 21, leading to waveform rounding at falling/rising of the delayed signal.

Therefore, when the DLL circuit 110 selects a delayed signal having waveform rounding at falling/rising and outputs the selected signal as the delayed drive pulse signal DL, the duty ratio of the delayed drive pulse signal DL deviates from 50%.

In the indirect ToF, the duty quality of the drive pulse signal for driving the pixel has a great impact on the distance measurement accuracy. Therefore, using the output signal (delayed drive pulse signal DL) of the DLL circuit 110 having poor duty quality as a control signal that drives the light receiving unit 12 with no processing would adversely affect the distance measurement accuracy.

In view of this, the second embodiment of the present disclosure uses a configuration in which the divider circuit 120 is disposed at the subsequent stage of the DLL circuit 110 so as to achieve the duty ratio same as that of the drive pulse signal A1. More specifically, by dividing the delayed drive pulse signal DL by 2, for example, as illustrated in FIG. 21, it is possible to restore the duty ratio of the divided pulse signal A2 to 50%.

Note that the frequency of the divided pulse signal A2 needs to be in line (synchronized) with the frequency of the light source control signal L. Therefore, in the distance measurement processing unit 13, the counter 134 generates the drive pulse signal A1 having a frequency corresponding to the division ratio of the divider circuit 120. With this operation, the distance measurement processing unit 13 can synchronize the divided pulse signal A2 and the light source control signal L with each other to have equalized frequency.

5. MODIFICATION

<5.1. Third Modification>

Although the distance measurement processing unit 13 shifts the phase of the drive pulse signal using the DLL circuit 110 of the phase shift circuit 136, phase shifting is not limited thereto. Since it is sufficient to achieve a predetermined amount of phase difference between the drive pulse signal and the light source control signal, the phase of the light source control signal may be shifted using a phase shift circuit.

Figure 22:
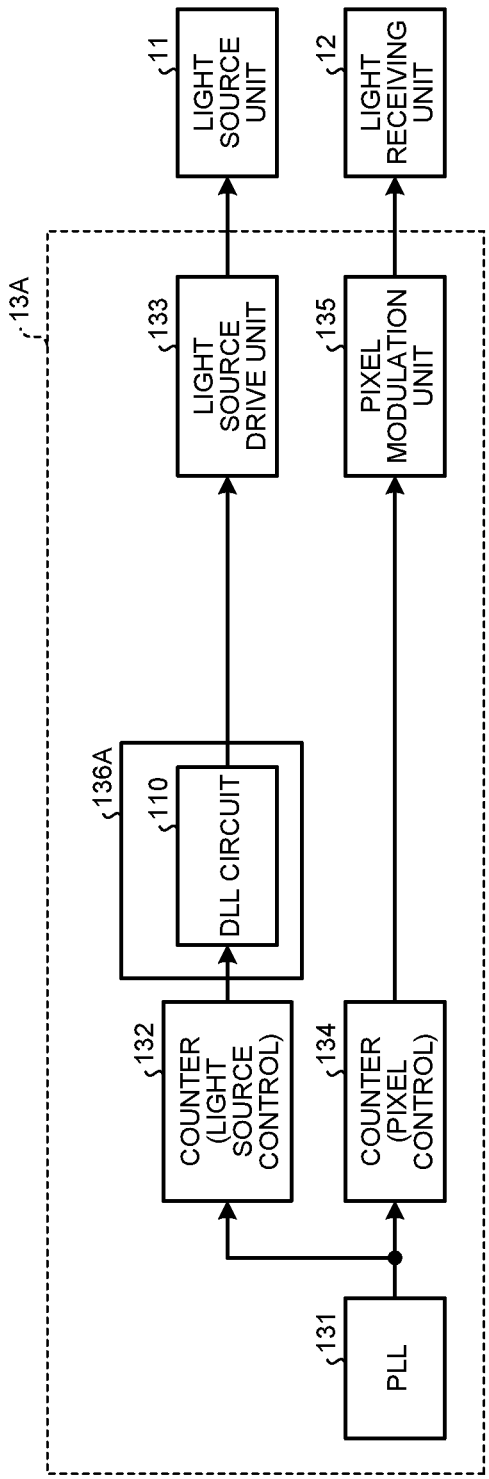
FIG. 22 is a block diagram illustrating a configuration example of a distance measurement processing unit according to a third modification of the second embodiment of the present disclosure.

FIG. 22 is a block diagram illustrating a configuration example of a distance measurement processing unit 13B according to a third modification of the second embodiment of the present disclosure.

As illustrated in FIG. 22, the distance measurement processing unit 13B according to the present modification is different from the distance measurement processing unit 13 illustrated in FIG. 17 in that there is a phase shift circuit 136A including a DLL circuit 110, provided between a counter 132 and a light source drive unit 133, and the counter 134 and a pixel modulation unit 135 are connected to each other. In addition, the distance measurement processing unit 13B is different from the distance measurement processing unit 13 illustrated in FIG. 17 in that the phase shift circuit 136A does not include the divider circuit 120.

The DLL circuit 110 of the distance measurement processing unit 13B shifts the phase of the light source control signal generated by the counter 132, and outputs the shifted light source control signal to the light source drive unit 133.

Since the duty quality as high as for the control of the light receiving unit 12 is not required for the control of the light source unit 11. Therefore, the distance measurement processing unit 13B according to the present modification does not need to include the divider circuit 120 at the subsequent stage of the DLL circuit 110. Therefore, the counters 132 and 134 generate the light source control signal and the drive pulse signal of the same frequency.

In this manner, the DLL circuit 110 may shift the phase of at least one of the light source control signal or the drive pulse signal.

6. CONCLUSION

The embodiments of the present technology are not limited to the above-described embodiment, and various modifications can be made without departing from the scope and spirit of the present technology.

A plurality of the present technologies described in the present specification can be implemented independently as a separate technique as long as there is no contradiction. Naturally, a plurality of any of present technology can be implemented in combination. For example, some or all of the present technology described in any of the embodiments can be implemented in combination with some or all of the present technology described in other embodiments. Furthermore, some or all of the above-described arbitrary present technology can be implemented in combination with other technologies not described above.

Furthermore, for example, a configuration described as one device (or processing unit) may be divided and configured as a plurality of devices (or processing units). Conversely, configurations described above as a plurality of devices (or processing units) may be collectively configured as one device (or processing unit). Furthermore, a configuration other than the above-described configuration may be added to the configuration of each device (or each processing unit). Furthermore, as long as the configuration and operation of the entire system are substantially the same, a part of the configuration of a certain device (or processing unit) may be included in the configuration of another device (or another processing unit).

Moreover, in the present specification, a system represents a set of a plurality of constituents (devices, modules (components), or the like), regardless of whether all the constituents are located in a same housing. Therefore, a plurality of devices housed in separate housings and connected via a network, and one device in which a plurality of modules are housed in one housing, are both systems.

The effects described in the present specification are merely examples, and thus, there may be effects other than the effects described in the present specification, not limited to the exemplified effects.

Note that the present technique can also have the following configurations.

Note that the following configurations also belong to the technical scope of the present disclosure.

(1)

A delay lock loop (DLL) circuit comprising:
  a phase delay circuit that generates a plurality of delayed signals having different phases according to a clock signal;
  a selection circuit that selects one of the plurality of delayed signals as an output signal according to a setting signal;

a detection circuit that detects a timing of switching the setting signal; and
a clock stop circuit that stops input of the clock signal to the phase delay circuit for a predetermined period including the timing detected by the detection circuit.

(2)
The DLL circuit according to (1), wherein the detection circuit detects the timing of switching the setting signal based on a switching signal.

(3)
The DLL circuit according to (1) or (2),
wherein the detection circuit further includes:
a plurality of flip-flops connected in multiple stages; and
a logic gate circuit that receives, as input, output signals from a first-stage flip-flop and a last-stage flip-flop, out of the plurality of flip-flops.

(4)
The DLL circuit according to (3), wherein the detection circuit includes the flip-flops having stages of a number according to the predetermined period.

(5)
The DLL circuit according to any one of (1) to (4), wherein the detection circuit switches the setting signal according to a switching signal.

(6)
The DLL circuit according to (5), wherein
the detection circuit further comprises:
a generation circuit that generates a control signal that switches the setting signal at a falling part and/or a rising part of the switching signal; and
a signal selection circuit that switches the setting signal according to the control signal.

(7)
A distance measuring sensor comprising:
a pixel that accumulates electric charge obtained by photoelectric conversion of reflected light, the reflected light being light emitted from a light source and reflected by a predetermined object, and outputs a detection signal corresponding to the accumulated electric charge;
a phase shift circuit that shifts a phase of at least one of a light emission control signal indicating an irradiation timing of the light source, and a drive pulse signal that is generated in correspondence with the light emission control signal and drives the pixel, such that a phase difference between the light emission control signal and the drive pulse signal becomes a plurality of different values in time division within one frame period,
wherein the phase shift circuit is provided with
a delay lock loop (DLL) circuit, the DLL circuit comprising:
a phase delay circuit that generates a plurality of delayed signals having different phases according to a clock signal;
a selection circuit that selects one of the plurality of delayed signals as an output signal according to a setting signal;
a detection circuit that detects a timing of switching the setting signal; and
a clock stop circuit that stops input of the clock signal to the phase delay circuit for a predetermined period including the timing detected by the detection circuit.

(8)
The distance measuring sensor according to (7), wherein the DLL circuit shifts a phase of the light emission control signal.

(9)
The distance measuring sensor according to (7), wherein the DLL circuit shifts a phase of the drive pulse signal, and
the phase shift circuit further includes a divider circuit that divides the drive pulse signal after the phase shift.

REFERENCE SIGNS LIST

1 ELECTRONIC DEVICE
10 DISTANCE MEASURING DEVICE
11 LIGHT SOURCE UNIT
12 LIGHT RECEIVING UNIT
13 DISTANCE MEASUREMENT PROCESSING UNIT
20 APPLICATION UNIT
100 SIGNAL GENERATION CIRCUIT
110, 110B, 110C DLL CIRCUIT
111 PHASE COMPARATOR
112 CHARGE PUMP
113 LOW-PASS FILTER
114 PHASE DELAY CIRCUIT
115, 1176 SELECTION CIRCUIT
116 CLOCK STOP CIRCUIT
117 SIGNAL SWITCHING DETECTION CIRCUIT
120 DIVIDER CIRCUIT
131 PLL CIRCUIT
132, 134 COUNTER
133 LIGHT SOURCE DRIVE UNIT
135 PIXEL MODULATION UNIT
136, 136A PHASE SHIFT CIRCUIT
1171 SYNCHRONIZATION CIRCUIT
1172 SWITCHING CIRCUIT
1173 STOP CONTROL CIRCUIT
1174 FIRST FLIP-FLOP GROUP
1175 SECOND FLIP-FLOP GROUP

The invention claimed is:

1. A delay lock loop (DLL) circuit, comprising:
a phase delay circuit that generates a plurality of delayed signals having different phases according to a clock signal;
a selection circuit that selects one of the plurality of delayed signals as an output signal according to a setting signal;
a detection circuit that detects a timing of switching the setting signal; and
a clock stop circuit that stops input of the clock signal to the phase delay circuit for a predetermined period including the timing detected by the detection circuit.

2. The DLL circuit according to claim 1, wherein the detection circuit detects the timing of switching the setting signal based on a switching signal.

3. The DLL circuit according to claim 1,
wherein the detection circuit further includes:
a plurality of flip-flops connected in multiple stages; and
a logic gate circuit that receives, as input, output signals from a first-stage flip-flop and a last-stage flip-flop, out of the plurality of flip-flops.

4. The DLL circuit according to claim 3, wherein the detection circuit includes the flip-flops having stages of a number according to the predetermined period.

5. The DLL circuit according to claim 1, wherein the detection circuit switches the setting signal according to a switching signal.

6. The DLL circuit according to claim 5, wherein
the detection circuit further comprises:
a generation circuit that generates a control signal that switches the setting signal at a falling part and/or a rising part of the switching signal; and a signal selection circuit that switches the setting signal according to the control signal.

7. A distance measuring sensor, comprising:

a pixel that accumulates electric charge obtained by photoelectric conversion of reflected light, the reflected light being light emitted from a light source and reflected by a predetermined object, and outputs a detection signal corresponding to the accumulated electric charge;

a phase shift circuit that shifts a phase of at least one of a light emission control signal indicating an irradiation timing of the light source, and a drive pulse signal that is generated in correspondence with the light emission control signal and drives the pixel, such that a phase difference between the light emission control signal and the drive pulse signal becomes a plurality of different values in time division within one frame period, wherein the phase shift circuit is provided with a delay lock loop (DLL) circuit, the DLL circuit comprising:

a phase delay circuit that generates a plurality of delayed signals having different phases according to a clock signal;

a selection circuit that selects one of the plurality of delayed signals as an output signal according to a setting signal;

a detection circuit that detects a timing of switching the setting signal; and a clock stop circuit that stops input of the clock signal to the phase delay circuit for a predetermined period including the timing detected by the detection circuit.

8. The distance measuring sensor according to claim 7, wherein the DLL circuit shifts a phase of the light emission control signal.

9. The distance measuring sensor according to claim 7, wherein the DLL circuit shifts a phase of the drive pulse signal, and the phase shift circuit further includes a divider circuit that divides the drive pulse signal after the phase shift.

* * * * *